(12) United States Patent
Tsuyuno et al.

(10) Patent No.: US 8,050,037 B2
(45) Date of Patent: Nov. 1, 2011

(54) ELECTRONIC CONTROL DEVICE USING LC MODULE STRUCTURE

(75) Inventors: Nobutake Tsuyuno, Tokai (JP); Hideto Yoshinari, Hitachinaka (JP); Hiroshi Hozoji, Hitachiota (JP); Masahiko Asano, Mito (JP); Masahide Harada, Yokohama (JP); Shinya Kawakita, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 688 days.

(21) Appl. No.: 12/190,624

(22) Filed: Aug. 13, 2008

(65) Prior Publication Data

US 2009/0086437 A1 Apr. 2, 2009

(30) Foreign Application Priority Data

Sep. 28, 2007 (JP) ................................. 2007-252983

(51) Int. Cl.
*H05K 7/20* (2006.01)
(52) U.S. Cl. ........ 361/714; 361/766; 361/709; 361/704; 361/679.46; 361/679.54; 174/16.3; 174/252; 174/520; 174/526; 174/527; 165/80.3; 165/104.33; 165/185
(58) Field of Classification Search ............. 361/679.46, 361/679.54, 704–712, 717–724, 730, 732, 361/734–736, 737, 752, 749; 165/80.2, 80.3, 165/104.33, 104.34, 185; 174/25 R, 16.3, 174/35 MS, 520, 526, 527; 257/679, 712, 257/713, 718, 719; 307/147; 363/143, 144
See application file for complete search history.

(56) References Cited

U.S. PATENT DOCUMENTS

| 5,170,931 | A | 12/1992 | Desai |
| 5,978,226 | A * | 11/1999 | Thomas et al. ............... 361/707 |
| 6,282,092 | B1 * | 8/2001 | Okamoto et al. ............. 361/704 |
| 6,522,528 | B2 * | 2/2003 | Yamane ........................ 361/601 |
| 6,724,627 | B2 * | 4/2004 | Onizuka et al. ............... 361/704 |
| 7,031,165 | B2 * | 4/2006 | Itabashi et al. ................ 361/719 |
| 7,414,873 | B2 * | 8/2008 | Winograd et al. ......... 365/49.17 |
| 7,643,297 | B2 * | 1/2010 | Tominaga et al. ............ 361/704 |
| 7,899,602 | B2 * | 3/2011 | Yoshinari et al. ............ 701/104 |
| 2005/0094356 | A1 * | 5/2005 | Onizuka et al. ............... 361/611 |
| 2007/0205038 | A1 | 9/2007 | Tominaga |

FOREIGN PATENT DOCUMENTS

| EP | 1 722 612 | 11/2006 |
| EP | 1 780 880 | 5/2007 |
| JP | 2004-119533 | 4/2004 |
| JP | 2004-350400 | 12/2004 |
| JP | 2005-245149 | 9/2005 |

* cited by examiner

*Primary Examiner* — Michail V Datskovskiy
(74) *Attorney, Agent, or Firm* — Antonelli, Terry, Stout & Kraus, LLP.

(57) ABSTRACT

In an electronic control device that includes two or more kinds of lead-insertion-type parts, including at least a coil and a capacitor, the parts are installed on a support that has a wiring, a terminal structure and mechanically fixing portions; the leads of the above parts are respectively inserted in and electrically connected to holes formed in the wiring portion of the support; the parts and the support are fixed to each other with an adhesion material for fixation; the upper surfaces of the parts are attached to a metallic chasis with a thermally conductive material of a low elasticity modulus interposed in between; the mechanically fixing portions of the support are fixed to the metallic chasis; and the terminal structure of the support is electrically connected to a circuit board that mounts at least a controlling element.

14 Claims, 13 Drawing Sheets

A

B

C

D

ELECTRONIC CONTROL DEVICE USING LC MODULE STRUCTURE

BACKGROUND OF THE INVENTION

1. Field of the Invention

The present invention relates to an electronic control device, used in an automobile, a robot and the like, having a battery as a power source, a built-in boost circuit, and built-in lead-insertion-type parts such as coils and capacitors.

With regard to automobiles, advanced electronic control is used from demand for mileage, tightening regulations for exhaust gas, safety, amenity, and quietness. For such advanced electronic control, an automobile uses a variety of electronic parts, and the high performance and high output power of these electronic parts increase the amount of heat release. Accordingly, cooling technology becomes important for those electronic parts.

There are disclosed the following cooling technologies for such electronic parts.

An engine controller cooling technology by interposing a heat radiation seat between a substrate on which electronic parts are mounted and a lid is known as indicated in Japanese Patent Application Publication No. 2004-119533.

As shown in Japanese Patent Application Publication No. 2005-245149, a power converter is known in which: a high-heat-conductive sheet is disposed between a capacitor and a base; and a high temperature conduction member is installed on the back side of a capacitor-mounting side of the base.

As illustrated in Japanese Patent Application Publication No. 2004-350400, a power converter is known in which: a high-heat-conductive sheet is disposed between a lid portion that thermally comes in contact with a smoothing capacitor and a base; and a high temperature conduction member is installed on the back side of a capacitor-mounting side of the base.

2. Description of the Related Art

Nowadays, actuators are frequently used for automobiles, and electronic control devices tend to be made highly powerful. On the other hand, from the viewpoints of environmental problems, attention is paid to direct injection gasoline engines that are capable of reducing the amount of exhaust nitrogen oxide and of achieving fuel saving. This engine is designed to inject a combustible high density fuel only into the vicinity of a sparking plug, and to burn the fuel supersparsely as a whole in the cylinder. An injector is used for this fuel injection. This injector must have a high output power since it needs to use a fuel pressurized in a high pressure. Generation of a high output power needs a large electric power that is determined by the product of current multiplied by voltage. An electric current for automobiles is supplied from a battery of about 12 V, which is a low voltage, and thus generation of a high output power with an increase of the current has limitation. This is because an increase of the current remarkably increases the amount of heat release by wire resistance since the amount of heat release is proportional to the second power of the current amount. Hence, there is a need for the generation of a voltage of 50 V or higher by means of a boost circuit.

Here, although the engine control unit for a direct injection gasoline engine has been illustrated as the example, an electronic control device using a battery as a power source, as in the case of the direct injection gasoline engine, has been increasingly requiring a boost circuit to be added to existing functions in order to achieve a high output power.

This boost circuit needs a coil and a capacitor that can endure voltage and current after boost. An electrolyte needs to be thickened to increase the pressure resistance of the capacitor, whereby the size of the capacitor will be enlarged even for the same capacity. For the coil, a troidal coil that uses ferrite or dust core is frequently used because a large amount of current is passed through the coil.

Such a coil and a capacitor are electronic lead-insertion-type parts, having a problem that automatic mounting of the lead-insertion-type parts on a circuit board requires considerable time and efforts, and also increases the frequency of error occurrence. In particular, a troidal coil is low in size precision, and shows a dimensional tolerance of about ±1 mm.

Because of this, the addition of a boost circuit to a conventionally used electronic control device poses problems that: a capacitor and a coil need to be attached outside; a great structural change is needed; and productivity is remarkably worsened. In addition, such a coil and a capacitor generate heat or are low in heat resistance, so that they need to be cooled. Hence, the coil and the capacitor have a problem that the cooling structure becomes complex when they are dispersedly mounted on a circuit board.

Because a heat radiation seat is interposed between a printed wiring board and a lid in Japanese Patent Application Publication No. 2004-119533, it is difficult to apply this technology to lead-insertion-type parts. Moreover, Japanese Patent Application Publications Nos. 2005-245149 and 2004-350400 do not relate to the lead-insertion-type parts, but relate only to the cooling technology for capacitors that are large-scale and fixed by screw clamps or the like. Additionally, since the above patent documents are based on the object to cool capacitor parts of the same, their application to various parts with different shapes and sizes is difficult.

The present invention has been made in consideration of the above problems and aims to provide a small, low-cost electronic control device that includes built-in lead-insertion-type parts such as a coil and a capacitor used for a boost circuit or the like, and its manufacturing method.

SUMMARY OF THE INVENTION

The present invention is an electronic control device that includes two or more kinds of lead-insertion-type parts, including at least a coil and a capacitor, the parts are installed on a support that has a wiring, a terminal structure and mechanically fixing portions; the leads of the above parts are respectively inserted in and electrically connected to holes formed in the wiring portion of the support; the parts and the support are fixed to each other with an adhesion material for fixation; the upper surfaces of the parts are attached to a metallic chasis with a thermally conductive material of a low elasticity modulus interposed in between; the mechanically fixing portions of the support are fixed to the metallic chasis; and the terminal structure of the support is electrically connected to a circuit board that mounts at least a controlling element.

In addition, the present invention is a method of manufacturing an electronic control device having two or more kinds of lead-insertion-type parts including at least a coil and a capacitor, comprising the steps of: inserting leads of the parts into holes formed in a wiring portion of a support having a wiring, a terminal structure and mechanically fixing portions; reversing the support and the parts so that the parts are below and that the support is above, electrically connecting the lead to the wiring and fixing the parts to the support with an adhesive for fixation in a state in which the upper surfaces of the two or more kinds of the parts are leveled with respect to the mechanically fixing portions with a space formed between the parts and the support by holding the mechanically fixing portions and upper surfaces of the parts to a jig having a surface in contact with the mechanically fixing portions of the support and having a flat portion a certain distance away from the surface; electrically connecting the terminal structure of the support to a circuit board mounting at least a controlling element; and fixing the support to the metallic chasis by the mechanically fixing portions in a state in which the upper surfaces of the parts are attached to a metallic chasis with a thermally conductive material, of a low elasticity modulus, interposed in between.

Utilization of an electronic control device using an LC module structure of the present invention makes it possible to obtain a small, low-cost electronic control device that houses lead-insertion-type parts such as coils and capacitors used for a boost circuit, and the like. Therefore, the present invention can be applied to the control and drive of a sensor, an actuator, and the like, for automobiles and robots, which need miniaturization thereof and reduction of power consumption in low voltage with use of batteries.

BRIEF DESCRIPTION OF THE DRAWINGS

FIGS. 1A to 1I are cross-sectional schematic diagrams under manufacturing and FIG. 1J is a cross-sectional schematic diagram of a final product.

FIGS. 2A to 2I are cross-sectional schematic diagrams under manufacturing and FIG. 2J is a cross-sectional schematic diagram of a final product.

FIGS. 3A to 3I are cross-sectional schematic diagrams under manufacturing and FIG. 3J is a cross-sectional schematic diagram of a final product.

FIGS. 4A to 4D are cross-sectional schematic diagrams under manufacturing and FIG. 4E is a cross-sectional schematic diagram of a final product.

FIGS. 5A to 5C are cross-sectional schematic diagrams under manufacturing and FIG. 5D is a cross-sectional schematic diagram of a final product.

FIGS. 7A to 7C are cross-sectional schematic diagrams under manufacturing and FIG. 3D is a cross-sectional schematic diagram of a final product.

DESCRIPTION OF THE PREFERRED EMBODIMENTS

Figure 1:
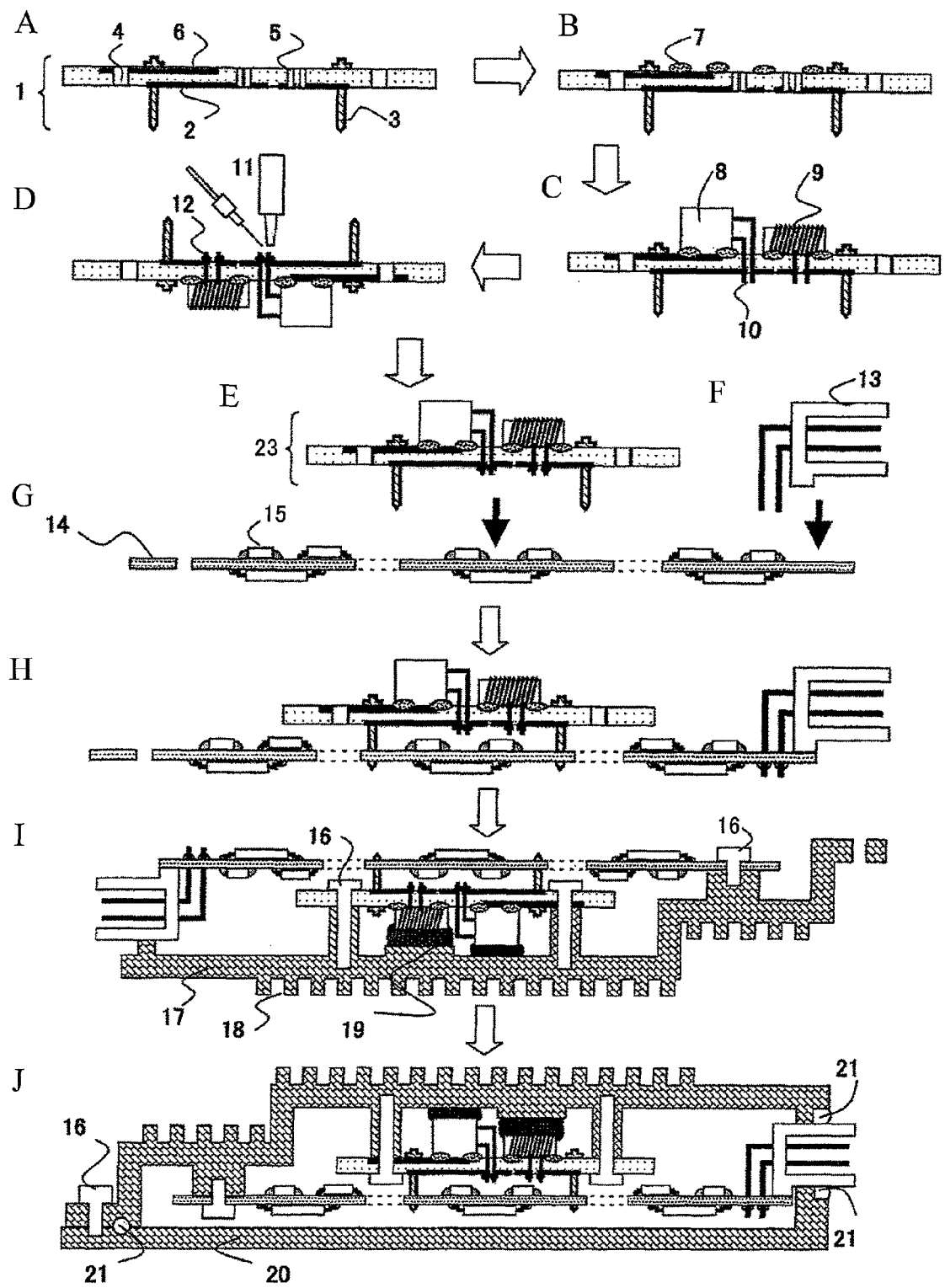
FIG. 1 is a cross-sectional schematic diagram related to a process of manufacturing an electronic control device according to the present invention.

This application is based on the Japanese patent application JP2007-252983, all the content of which is incorporated in this application by reference.

An embodiment of the present invention will be described hereinafter.

An electronic control device of the present invention includes two or more kinds of lead-insertion-type parts, including at least a coil and a capacitor, the parts are installed on a support that has a wiring, a terminal structure and mechanically fixing portions; the leads of the above parts are respectively inserted in and electrically connected to holes formed in the wiring portion of the support; the parts and the support are fixed to each other with an adhesion material for fixation; the upper surfaces of the parts are attached to a metallic chasis with a thermally conductive material of a low elasticity modulus interposed in between; the mechanically fixing portions of the support are fixed to the metallic chasis; and the terminal structure of the support is electrically connected to a circuit board that mounts at least a controlling element.

The size of a circuit board greatly influences the overall dimension of an electronic control device. Lead-insertion-type parts, such as a coil, a capacitor and a sensor are not many in number, but each of them occupies a large mounting area. Therefore, fabricating an LC module by consolidating lead-insertion-type parts contributes to reduce the size of a circuit board to effectively miniaturize an electronic control device. In addition, when lead-insertion-type parts having a dimensional tolerance as large as about ±1 mm such as a troidal coil are automatically mounted, the frequency of positioning error occurrence is comparatively high and manual adjustment is needed, whereby productivity is worsened. On the other hand, when the parts are consolidated in an LC module separately from a circuit board, errors due to automatic mounting are decreased, thereby effectively improving productivity. Furthermore, the small number of parts are mounted on this LC module, so that the productivity is high even in assembling manually. Moreover, since a coil and a capacitor with large heat release and capacitors and sensors with a low heat resistance can be consolidated, cooling structures of two or more kinds of parts having different shapes and sizes can be collectively installed in a simple structure in which the parts are fixed to a metallic chasis via a thermally conductive material of a low elasticity modulus.

In addition, it is preferred that the leads of the above parts are electrically inserted and connected to holes formed in the wiring portion of the support, that there is a space between the above parts and the support and that the positions of the upper surfaces of the above parts of two or more kinds are on the same level.

There is a disadvantage that the heights of parts vary depending on the way of insertion of leads of lead-insertion-type parts because of the presence of long leads. However, oppositely, the upper surfaces of parts are arranged on the same level by adjustment of the way of insertion of leads and by the presence of a space between parts and the support in the present invention. In other words, even though two or more kinds of parts of different shapes and sizes are used or parts of a large dimensional tolerance are used, the upper surfaces of parts are arranged on the same level. This makes it possible to use a thermally conductive material of the same thickness on even a plurality of parts, and thereby to effectively improve productivity. In addition, since the upper surfaces of parts are arranged on the same level, the variation of the heights of parts does not need to be adjusted by having the thickness of the thermally conductive material absorb the height variation, so that the thermally conductive material is made thin and its amount of use can be decreased, thereby effectively lowering the cost. Moreover, thinning a thermally conductive material can lead to high heat radiation, thereby being capable of improving high temperature operation reliability.

Additionally, the support is preferably made to have a case-like shape formed by insert molding. Use of a case-like shaped support effectively gives more choice of adhesives because the outflow can be prevented even if an adhesive with a low viscosity is used for fixing the above parts to the support. Moreover, vibration resistance can be effectively improved because the sidewall can be used for fixing the parts with an adhesive. In addition, the insert molding fabrication effectively leads to high productivity since a case structure, a wire and a terminal structure can be collectively formed.

In addition, the electronic control device of the present invention is the one in which the upper surfaces of the above parts are tightly attached to a metallic chasis through a sheet-like shaped thermally conductive material of a low elasticity modulus. Since the upper surfaces of parts of two or more kinds are arranged on the same level, a plurality of upper surfaces of the parts can be uniformly made in contact with the metallic chasis using a sheet-shape thermally conductive material of a constant thickness, whereby the productivity is high. Additionally, because the upper surfaces of parts of two or more kinds are arranged on the same level, upper surfaces of the parts can be uniformly made in contact with the metallic chasis with use of a thin, thermally conductive material, thereby effectively lowering the cost. Moreover, for the purpose of lowering the cost, even in the case where the sheet area is made small and divided and used only for a necessary portion, sheets of thermally conductive materials of the same thickness are acceptable, so that the productivity can be more effectively improved than the case where a plurality of thicknesses of sheets are needed.

In addition, holes are formed in a support and an adhesive for fixation is injected and hardened therefrom to thereby fix the above parts to the support. This enables an adhesive to be injected from the support side, and thus an adhesive of high viscosity and high thixotropy can be used. Since the flow of such an adhesive during hardening is small, the adhesive of a small amount can be applied to a portion needed for fixation of parts, thereby being capable of lowering the cost. Additionally, in a manufacturing method of reversing the top and bottom of parts and a support and leveling the heights of the parts, an adhesive can be applied in a state in which the unit is reversed and the support is made to be above, whereby the positions of the parts are readily leveled and the productivity is made high.

Moreover, the upper surfaces of the above parts are preferably made contact with a metallic chasis through a thermally conductive material of an elasticity modulus lower than that of an adhesive for fixation. When a space is disposed between parts and a support and the positions of the upper surfaces of parts are leveled, force that holds the upper surfaces of the parts to a metallic chasis through a thermally conductive material is also added to an adhesive that is loaded in a space between the parts and the support and fixes the parts. When the amount of deformation of this adhesive is large, the stress that is applied to an electric joint of a lead and a wiring is increased. However, the elasticity modulus of an adhesive for fixation is made larger than the elasticity modulus of a thermally conductive material to be thereby able to decrease the stress that is added to the electric joint of a lead and a wiring, and therefore the temperature cycle reliability of the joint is effectively improved.

Furthermore, a thermally conductive material is made to be a hardened material of an adhesive to be thereby flexibly made contact with complex parts with different shapes and sizes to in turn increase the contact area and improve heat radiation, effectively improving high temperature operation reliability.

In addition, states are preferably made in which a thermally conductive material is made to be a hardened material of an adhesive and the hardened material of the adhesive is in contact with the above metallic chasis and the above parts and is bonded to only either of the above metallic chasis and the above parts. Specifically, this state is where the hardened material of the adhesive is bonded to the metallic chasis and makes contact with, but is not bonded to, the upper surfaces of the above parts, or the hardened material of the adhesive is bonded to the above parts and is in contact with, but is not bonded to, the metallic chasis.

An adhesive of a precursor of a thermally conductive material is applied in advance to the metallic chasis side or the side of parts by way of printing or dispensing and is hardened, to thereby effectively improve productivity as compared with the case where the material is hardened at assembly. In addition, when an adhesive of a precursor of a thermally conductive material is applied in advance to the concave portion of a metallic chasis and is hardened, the thickness of the thermally conductive material can be controlled with use of a concave shape. This improves the position precision at the time of mechanically fixing the parts and the metallic chasis, thereby being capable of decreasing the force of mechanically pressing the parts, so that the deformation of the parts can be prevented. In addition, this reduces the stress applied to the electric joint of the lead and the wiring, thus being able to effectively improve the temperature cycle reliability. Moreover, the projection of the mechanically fixed portion of the metallic chasis side outward enables the mechanically fixed portion not only to be utilized as a portion of a heat sink, but also to have the flat inside, thereby effectively and readily printing the thermally conductive material in the concave portion disposed in the metallic chasis.

Additionally, a thermally conductive material is bonded to the parts, an adhesive of a precursor of the thermally conductive material is applied to the upper surfaces of the parts and then the resulting surface is flattened with a jig and hardened, thereby being uniformly and capable of making contact with a metallic chasis, improving heat radiation and high temperature operation reliability. Moreover, flattening of the adhesive at a constant position with respect to the mechanically fixing portions makes it possible to control the force applied to the parts when the parts are fixed to the mechanically fixing portions, and thereby to effectively prevent the deformation of the parts which might otherwise be caused by too much pressing and floatage due to pressing shortage.

Furthermore, the support is preferably a combination of a thermoplastic resin produced by insert-molding a terminal structure element and a wiring and a metal case having mechanically fixing portions. This makes it possible to release heat to both the metal case and metallic chasis sides, so that heat radiation can be effectively improved to thereby restrain the fluctuation of electrical properties due to temperature change.

In addition, the support is preferably produced with at least a metallic material for heat radiation embedded inside a surface in contact with a capacitor on a capacitor mounting portion. This particularly enables the heat of a capacitor portion to be released to both of the case and metallic chasis sides. A capacitor is significant in life decrease due to temperature increase, causing a bottleneck of reliability life of an electronic control device. Hence, improvement of heat radiation in a capacitor portion permits the high temperature operation reliability of an electronic control device to be improved.

Additionally, a support preferably has at least a wiring for heat radiation in a capacitor mounting portion. This makes it possible to improve heat radiation by making use of a wiring structure, thereby effectively reducing the cost.

Moreover, an aluminum electrolytic capacitor can be used for a capacitor installed in an electronic control device of the present invention. The aluminum electrolytic capacitor preferably has the following characteristics: The aluminum electrolytic capacitor has a lead for heat radiation in the central portion of the capacitor in addition to leads of positive and negative poles; A lead for heat radiation is at least electrically insulated in an aluminum foil and a portion in contact with an electrolyte of the inside of a capacitor; Three leads for a positive pole, a negative pole, and heat radiation are connected to a substrate or metallic wiring.

The temperature becomes the highest in the central portion of a capacitor, and thus a lead for heat radiation is disposed in the central portion of the capacitor and connected to the substrate and metallic wiring, thereby being capable of releasing the heat of the capacitor to the substrate and the metal wiring. This effectively improves the capacitor's life. In addition, since the capacitor's life becomes a bottleneck of the reliability life of an electronic control device, use of such a capacitor effectively improves the life of an electronic control device.

The electronic control device of the present invention comprises two or more kinds of lead-insertion-type parts, including at least a coil and capacitor. The electronic control device can be fabricated in the following manner: inserting leads of the parts into holes formed in a wiring portion of a support having a wiring, a terminal structure and mechanically fixing portions; reversing the support and the parts so that the parts are below and that the support is above, electrically connecting the lead to the wiring and fixing the parts to the support with an adhesive for fixation in a state in which the upper surfaces of the two or more kinds of the parts are leveled with respect to the mechanically fixing portions with a space formed between the parts and the support by holding the mechanically fixing portions and upper surfaces of the parts to a jig having a surface in contact with the mechanically fixing portions of the support and having a flat portion a certain distance away from the surface; electrically connecting the terminal structure of the support to a circuit board mounting at least a controlling element; and fixing the support to the metallic chasis by the mechanically fixing portions in a state in which the upper surfaces of the parts are attached to a metallic chasis with a thermally conductive material, of a low elasticity modulus, interposed in between.

The leads of the lead-insertion-type parts are inserted into holes in the wiring and then the unit is turned upside down to thereby drop the parts under the parts' gravity, effectively increasing productivity because the upper surfaces of the parts are collectively leveled at a predetermined position from mechanically fixing portions. The diameter of each hole in the wiring into which the lead is inserted is desirably two or more times larger than the lead diameter in order to prevent a catch of the lead. In addition, the positions of the upper surfaces of the parts can be made constant on the basis of the position of the mechanically fixing portions and the force applied to the parts when fixed by the mechanically fixing portions can be controlled, whereby the deformation of the parts due to too much pressing or floatage caused by pressing shortage can be effectively prevented.

Additionally, the electronic control device of the present invention can be fabricated in the following steps: installing the above parts on a support that has a wiring, a terminal structure and mechanically fixing portions, electrically connecting the leads of the above parts to the wiring portion of the support while the leads are inserted in holes in the wiring portion of the support, fixing the above parts to the support with an adhesive for fixation, applying an adhesive of a precursor of a thermally conductive material to the upper surfaces of the above parts, attaching the surfaces with the adhesive unhardened to a metallic chasis, and subsequently hardening the adhesive.

A thermally conductive material adheres to both the parts and the metallic chasis and thus, even if the number of mechanically fixing portions is reduced, the contact between the upper surfaces and the metallic chasis can be maintained via the thermally conductive material, thereby being able to effectively reduce the cost and improve productivity. Moreover, even if the parts and the metallic chasis are mechanically weakly pressed to each other via a thermally conductive material, the parts may not be separated. This produces effects in which, since the pressing force can be weakened, deformation of the parts can be prevented; and in which the temperature cycle reliability of the joint is improved by reducing the stress applied to the lead and the electric join.

For a thermally conductive material of a low elasticity modulus in the present invention, the material can be used without problems if the thermal conductivity is 0.2 W/mK or higher and the elasticity modulus at 25° C. is from 1 MPa to 0.1 MPa, both inclusive. In addition, when the heights of parts are leveled as in the present invention, the thermally conductive material can be used if the elasticity modulus is 1 GPa or less. This is because application of a large force is needed to attach parts with a large dimensional tolerance tightly to the thermally conductive material when the elasticity modulus is high and thus the parts deformed or the temperature cycle reliability of the joint is lowered; however, the force for attaching parts tightly may be small when the upper surfaces of the parts are at a constant position with respect to mechanically fixing portions. In addition, there is a difficult problem in handling of a thermally conductive material when the elasticity modulus of the material is less than 0.1 MPa. However, when an adhesive of a precursor of a thermally conductive material is applied to a metallic chasis and hardened as in the present invention, the adhesive can be integrally handled with the metallic chasis even if the elasticity modulus is less than 0.1 MPa, and therefore the resulting material can be used without problems. Examples that can be used include epoxy resins, silicone resins, polyimides, urethane resins and materials produced by filling them with an inorganic filler or a metal filler coated with an insulator. Note that it is desirable that this thermally conductive material is insulative. This is because the case of an aluminum electrolytic capacitor touches an electrolyte, and thus is electrically communicated with a cathode; however, insulation is not guaranteed although the surface of the case is coated with a coat of vinyl chloride, polyethylene, or the like. When a silicone resin is used, a silicone resin made of usual polydimethylsiloxane can be used. The substance has a second-order transition temperature of about −40° C. and below this temperature the elasticity modulus is increased by a factor of about 100 times. Therefore, it is desired that a functional group such as a phenyl group that inhibits the crystallization of polydimethylsiloxane be added to a main or side chain to make the second-order transition temperature less than −50° C. This is because automobiles are sometimes used in cold climates.

In addition, for the support, a structure that has a portion with a thickness of 1.5 mm or larger and that has a wiring, a terminal structure, and mechanically fixing portions can be used. This is because, if the support is a structure that has a portion with a thickness of 1.5 mm or larger, the deformation, when it is mechanically fixed, can be reduced. The shape is desirably flat-plane shaped or case-like shaped. This is for the purpose of straightforward production and mechanical fixation. The examples of the support that can be used include a thick circuit board equipped with a terminal, a case having insert-molded therein a wiring and a terminal, a material, a structure produced by bonding a metal case having mechanically fixing portions to a flat plate having insert-molded therein a wiring and a terminal, and the like. However, if a material of a thickness of 1.5 mm or larger is used for a circuit board mounting an LC module and if mechanically fixing portions for a metallic chasis is disposed in a circuit board, the support may not be provided with mechanically fixing portions.

An epoxy resin, a silicone resin and those resins filled with an inorganic filler can be used for an adhesive for fixation.

The material for heat radiation desirably has a thermal conductivity of 50 W/mK or more, and a metallic board and a ceramic sheet can be used therefor.

The lead-insertion-type parts in the present invention mean electronic parts, such as a coil, a capacitor, a sensor and a semiconductor package, configured to have electrical connection by insertion of their leads.

In addition, the LC module means a module that contains at least a coil and a capacitor and is modulated so as to be capable of collectively handling a plurality of electronic parts.

The mechanically fixing portions means a structural portion necessary for mechanical fixation such as a screw clamp or a press fit.

The upper surfaces of parts mean the surfaces of parts of the counter side to a support when the support is provided with the parts.

The wiring for heat radiation means the wiring portion of the support that is not electrically connected to the lead-insertion-type parts. Although not necessarily shown, a surface making contact with a capacitor desirably has formed thereon an insulative film. This is because a plurality of capacitors are prevented from being short-circuited with a wiring for heat radiation through the case.

The circuit board means a substrate made of a resin having a laminated structure of two layers or more.

Contact means a state in which material bodies touch each other and means both of bond and contact without bond.

Bond means a state in which material bodies bond to each other by chemical reaction.

Fixation means a state in which a material does not move physically.

The metallic chasis means a chasis made of a metal, for which, for instance, an aluminum die cast, a magnesium die cast, or the like can be used.

The metallic base means a base plate made of a metal, for which, for instance, an aluminum die cast, a magnesium die cast, a steel board, or the like can be used.

The external connector means a connector that is electrically connected to a circuit board inside an electronic control device and that is to be electrically connected to the outside of the electronic control device.

Insert molding means a method of molding a thermoplastic resin in which a metal or a ceramic is embedded.

The outside means an external portion of a chasis.

The thermal conductivity means a value measured by a laser flash method.

The thixotropy means a value obtained by dividing a viscosity at a shear rate of 1 (1/s) by a viscosity at a shear rate of 10 (1/s), at 25° C.

The viscosity means a viscosity at 25° C. at a shear rate of 10 (1/s).

The elasticity modulus means a longitudinal elastic modulus. The elasticity modulus can be calculated from a storage modulus of a dynamic viscoelasticity measurement or from an initial inclination of a stress-distortion curve in a tensile test. Alternatively, a value three times a shear modulus of rigidity measured with a viscometer or the like may be used.

Examples and Comparative Examples of the present invention will be set forth hereinafter.

Example 1

FIG. 1 shows a cross-sectional schematic diagram concerning a process of manufacturing an electronic control device of Example 1. In FIG. 1A, a support 1 is a two-layer wiring board substrate of a whole thickness of 2 mm having a wiring 2 made of copper or aluminum of a thickness of 200 μm, and the support has screw holes as mechanically fixing portions 4, a terminal structure 3, and a wiring 6 for heat radiation. An insulative resist is applied onto the wiring 6 for heat radiation (not shown). The holes 5 are formed in the wiring portion for inserting leads, and the diameter of each hole is twice the diameter of the lead to be inserted.

Next, as shown in FIG. 1B, an adhesive 7 for fixation made of a silicone resin with a viscosity of 200 Pa·s, a thixotropy of 1.6 and a post-hardening elastic modulus of 1 MPa was applied to a support 1. Then, as shown in FIG. 1C, the leads 10 of lead-insertion-type parts such as a capacitor 8, a coil 9 and a sensor (not shown) were inserted into the holes of the wiring of the support and the parts were installed on the support.

After this, the adhesive for fixation was hardened in a thermostat bath. Next, as shown in FIG. 1D, an electric joint 12 of the lead and the wiring was formed with an electric connection device 11. For this electric connection device, a soldering device and a welding device can be used. An LC module 23 fabricated in this manner is shown in FIG. 1E. In addition, as shown in FIG. 1G along with this, surface mount devices 15, i.e. a controlling element such as a microcomputer, a capacitor, a resistance, a diode, and a switching element were mounted on a circuit board 14.

Next, as illustrated in FIG. 1H, the LC module 23 and an external connector 13 were mounted on this circuit board 14 and electrical connection was made by means of a spot flow.

Then, as shown in FIG. 1I, a thermally conductive material 19, of a sheet-like shape, of a thermal conductivity of 1 W/mK and an elastic modulus of 0.1 MPa was set up in a metallic chasis 17 made of an aluminum die cast equipped with a heat radiation fin 18. A sheet of a thickness of 5 mm was used in a portion in contact with the coil 9; a sheet of a thickness of 3 mm was used in a portion in contact with the capacitor 8. The reason why the sheet in contact with the coil is thick is that the dimensional tolerance of the coil is as large as ±1 mm. In addition, the circuit board connected to the LC module and the external connector was mounted there and fixed with use of screws as mechanically fixing materials 16 in four sites.

Next, as shown in FIG. 1J, an adhesive 21 for sealing made of a silicone resin was applied to the mating surfaces of a metallic base 20, the external connector 13 and the metallic chasis 17 and was hardened in the thermostat bath.

The external shape of a completed electronic control device had dimensions of 150×150×50 mm.

Figure 19:
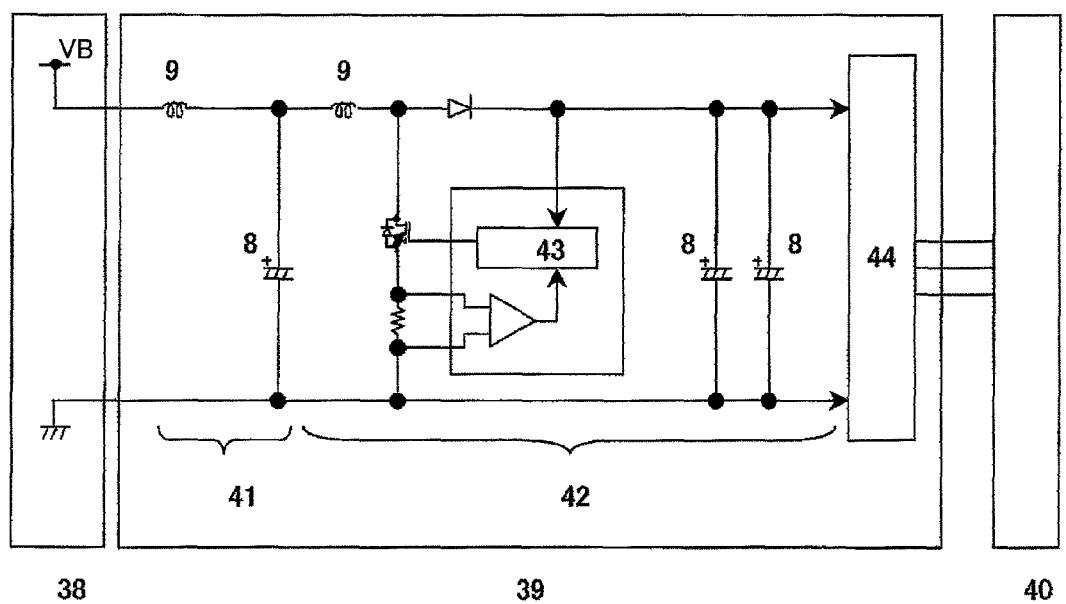
FIG. 19 is a circuit diagram of an electronic control device and a related device according to the present invention.

FIG. 19 shows the fabricated electronic control device and a circuit diagram of its related device. An electric power is supplied to electronic control device of the present invention from a battery 38. The electronic control device smoothes the fluctuation of the supplied electric power in a filter circuit 41, increases the voltage to 60 V using a boost circuit 42 and drives a motor or an actuator 40 through a power circuit 44.

Table 1 shows the results of the evaluation of characteristics and the reliability tests of an electronic control device fabricated in this manner.

For the sizes of electronic control devices, when the external area of an electronic control device was capable of being made to be 225 cm² or smaller, the evaluation was marked as ○ and when the area was more than 225 cm², the evaluation was marked as x. When the area of the circuit board can be decreased, the external area of the electronic control device can be reduced, whereby the device can be effectively miniaturized.

Moreover, the number of mechanically fixing portions of an LC module made for trial purposes was indicated by a numerical value. If there are no problems in vibration resistance, reduction in the number of mechanically fixing portions can effectively lower the cost.

Furthermore, when the thickness of a thermally conductive material was 5 mm or less, the evaluation was "excellent"; when the thickness was from 2 mm to 5 mm, both inclusive, the evaluation was ○; when the thickness was larger than 5 mm, the evaluation was x. The smaller the thickness of a heat radiation material was, the smaller the amount of use was, effectively leading to a lower cost.

For the productivity of an assembly step, the manufacturing cost except a direct material cost was relatively evaluated on the basis of the case in Example 1. When the case was equivalent to the case in Example 1, the evaluation was set to be ○, the case lower than that was set to be "excellent" and the case higher than that was set to be x.

In addition, with temperature cycle reliabilities, the temperature cycle test was carried out with use of 25 electronic control devices that operate normally by setting one cycle for one hour at −40° C. and one hour at 125° C. When the number of cycles for defective operation is 1500 or smaller, the evaluation was marked as x, and when the number is larger than 1500, the evaluation was marked as ○.

Additionally, as for high temperature operation reliability, an electronic control device was normally operated at a temperature of 100° C. at a wind speed of 1 m/sec. After 2,000 h, the evaluation was marked as x when the electrostatic capacity of the capacitor was decreased by 20% or more. The evaluations were made ○ and "excellent" when the capacities were decreased by from 10% inclusive to 20% exclusive and by less than 10%, respectively.

Moreover, as for vibration resistance, the evaluation was based on the case in Example 1. The equivalent case was ○, the better case was "excellent" and the worse case was x.

The electronic control device fabricated in this manner is small and low-cost and exhibits high productivity and high heat radiation, thus high temperature operation reliability is high and vibration resistance is excellent.

Example 2

Figure 2:
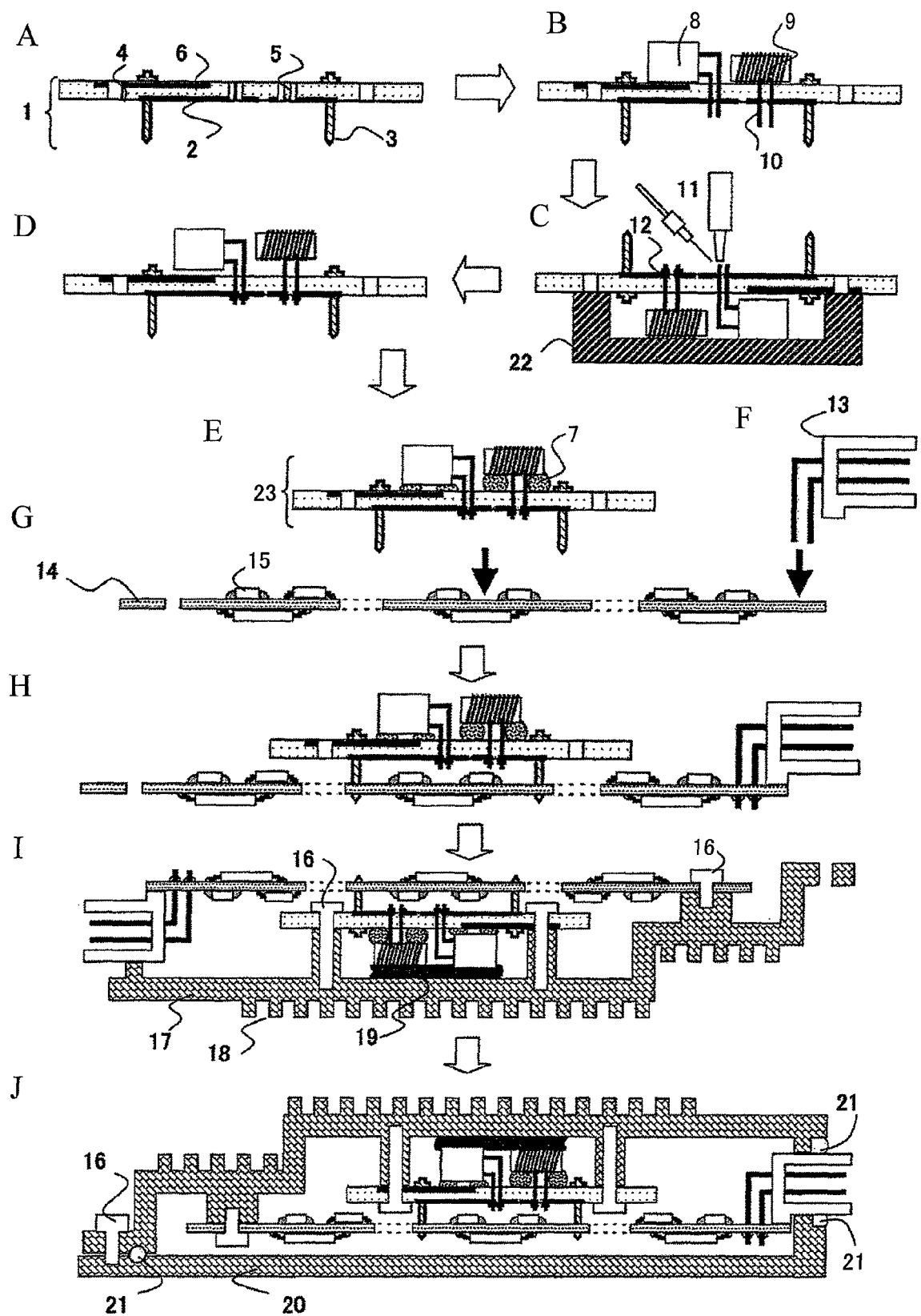
FIG. 2 is a cross-sectional schematic diagram related to a process of manufacturing an electronic control device according to the present invention.

FIG. 2 shows a cross-sectional schematic diagram concerning a process of manufacturing an electronic control device of Example 2. In FIG. 2A, a support 1 is a two-layer wiring board substrate of a whole thickness of 2 mm having a wiring 2 made of copper or aluminum of a thickness of 200 μm, and the support has screw holes as the mechanically fixing portions 4, the terminal structure 3, and a wiring 6 for heat radiation. An insulative resist is applied onto the wiring 6 for heat radiation (not shown). The holes 5 are formed in the wiring portion for inserting leads, and the diameter of each hole is twice the diameter of the lead to be inserted.

Next, as shown in FIG. 2B, the leads 10 of the lead-insertion-type parts such as a capacitor 8, a coil 9 and a sensor (not shown) were inserted into the holes 5 of the wiring of the support and the parts were installed on the support.

After this, as shown in FIG. 2C, the unit thus obtained was reversed so that the parts were below and the support was above, and then installed to a jig 22 having a surface in contact with the mechanically fixing portions of the support and having a flat portion a certain distance away from the surface. At this time, the hole 5 was two or more times larger than the lead diameter, and thus the parts were dropped under their own gravity to thereby generate a space between the parts and the support. This leveled the upper surfaces of parts different in size and shape relative to the mechanically fixing portions.

Next, under this condition, the electric joint 12 of the lead and the wiring was formed with the electric connection device 11.

Then, the top and bottom was turned upside down again as shown in FIG. 2D. In addition, as shown in FIG. 2E, the adhesive 7 for fixation made of an epoxy resin with a viscosity of 200 Pa·s, a thixotropy of 1.5 and a post-hardening elastic modulus of 3 GPa was applied to the space between the parts and the support and was hardened, to thereby fabricate an LC module 23.

Moreover, as shown in FIG. 2G along with this, surface mount devices 15 i.e. a controlling element such as a microcomputer, a capacitor, a resistance, a diode, and a switching element were mounted on a circuit board 14.

Next, as illustrated in FIG. 2H, the LC module 23 and the external connector 13 were mounted on this circuit board 14 and electrical connection was made by means of a spot flow.

Then, as shown in FIG. 2I, a thermally conductive material 19, of a sheet-like shape, of a thermal conductivity of 1 W/mK and an elastic modulus of 100 MPa was set up in the metallic chasis 17 made of an aluminum die cast equipped with the heat radiation fin 18. A sheet of a thickness of 1 mm was used in a portion in contact with the coil 9; a sheet of a thickness of 1 mm was used in a portion in contact with the capacitor 8. The reason why thin sheets with the same thickness can be used is that the positions of the upper surfaces of the parts are leveled with respect to the mechanically fixing portions.

In addition, the circuit board connecting the LC module and the external connector thereto was mounted there and fixed with screws in the mechanically fixing material 16 thereof in its four sites.

Next, as shown in FIG. 2J, the adhesive 21 for sealing made of a silicone resin was applied to the mating surfaces of the metallic base 20, the external connector 13 and the metallic chasis 17 and was hardened in the thermostat bath.

The external shape of a completed electronic control device had dimensions of 150×150×50 mm.

Table 1 shows the results of the evaluation of characteristics and the reliability tests of an electronic control device fabricated in this manner.

The electronic control device fabricated in this manner is small and low-cost and exhibits high productivity and high heat radiation, thus high temperature operation reliability is high.

Example 3

Figure 3:
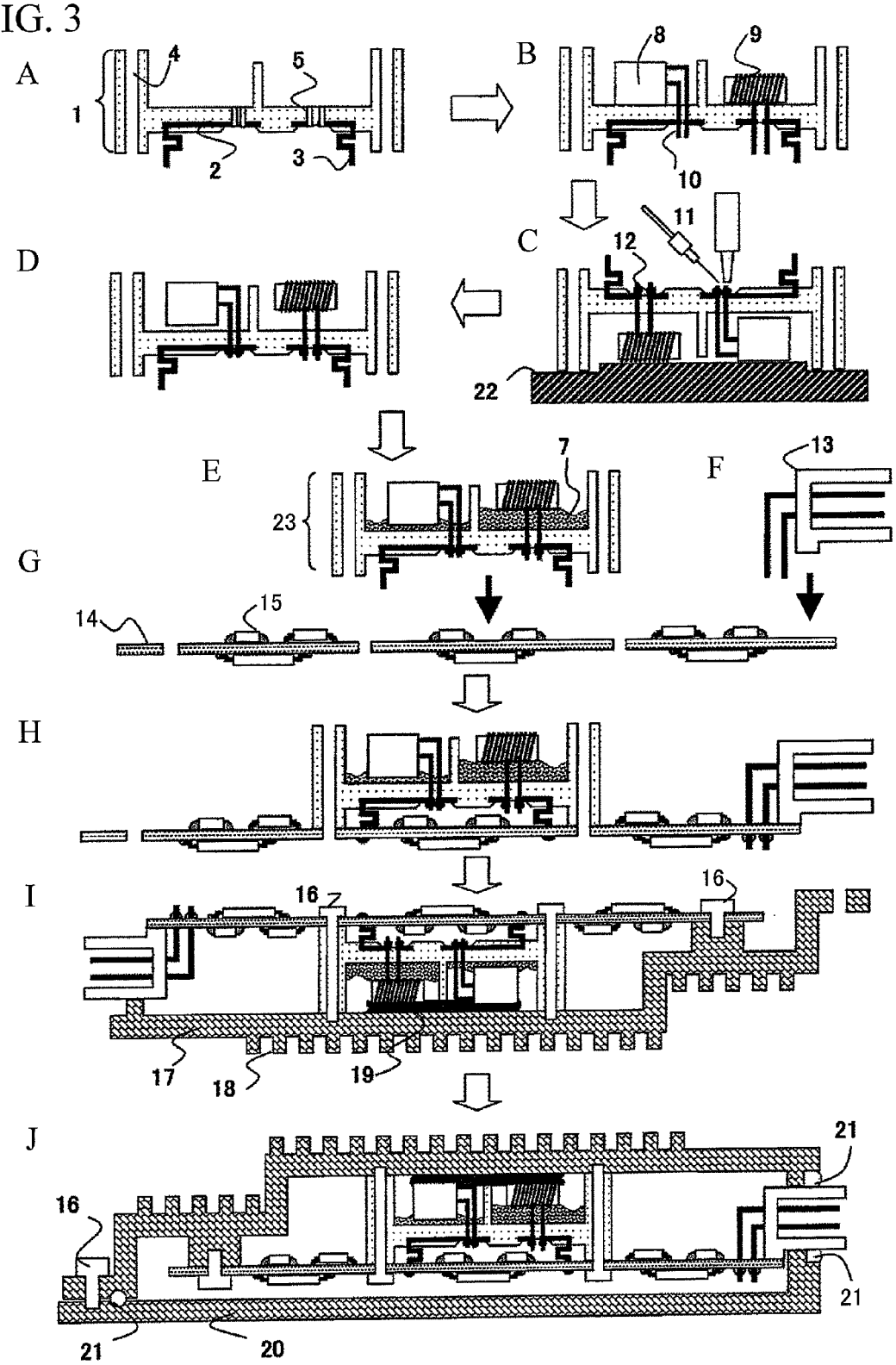
FIG. 3 is a cross-sectional schematic diagram related to a process of manufacturing an electronic control device according to the present invention.

FIG. 3 shows a cross-sectional schematic diagram concerning a process of manufacturing an electronic control device of Example 3. In FIG. 3A, a support 1 utilizes a copper sheet of a thickness of 600 μm as a wiring 2, and is a case fabricated by insert molding of a thermoplastic resin in which an average wall thickness may be about 1 mm but a wall thickness at mechanically fixing portions and a portion subjected to stress are 1.5 mm or more.

Then, the support has, as the mechanically fixing portions 4, screw holes in which metal cylinders are embedded and has a terminal structure 3 in which the wiring is bent and the tip is processed. In addition, the wiring is appropriately plated.

The holes 5 are formed in the wiring portion for inserting leads 10, and the diameter of each hole is twice the diameter of the lead to be inserted.

Next, as shown in FIG. 3B, the leads 10 of the lead-insertion-type parts such as a capacitor 8, a coil 9 and a sensor (not shown) were inserted into the holes 5 of the wiring of the support and the parts were installed on the support.

After this, as shown in FIG. 3C, the unit was reversed so that the parts were below while the support were above, and then installed to a jig 22 having a surface in contact with the mechanically fixing portions of the support and having a flat portion a certain distance away from the surface. At this time, the hole 5 was two or more times larger than the lead diameter and thus the parts were dropped under their own gravity to thereby generate a space between the parts and the support. This leveled the upper surfaces of the parts different in size and shape relative to the mechanically fixing portions.

Next, under this condition, an electric joint 12 of the lead and the wiring was formed with the electric connection device 11.

Then, the top and bottom was turned upside down again as shown in FIG. 3D. In addition, as shown in FIG. 3E, an adhesive 7 for fixation made of an epoxy resin with a viscosity of 50 Pa·s, a thixotropy of 1.1 and a post-hardening elastic modulus of 3 GPa was applied to a space between the parts and the support and was hardened, to thereby fabricate the LC module 23.

Moreover, as shown in FIG. 3G along with this, the surface mount devices 15 i.e. a controlling element such as a microcomputer, a capacitor, a resistance, a diode, and a switching element were mounted on a circuit board 14.

Next, as illustrated in FIG. 3H, the LC module 23 and the external connector 13 were mounted on this circuit board 14 and electrical connection was made by means of a spot flow.

Then, as shown in FIG. 3I, the thermally conductive material 19, of a sheet-like shape, of a thermal conductivity of 1 W/mK and an elastic modulus of 100 MPa was set up in the metallic chasis 17 made of an aluminum die cast equipped with the heat radiation fin 18. A sheet of a thickness of 1 mm was used in a portion in contact with the coil 9; a sheet of a thickness of 1 mm was used in a portion in contact with the capacitor 8. The reason why thin sheets with the same thickness can be used is that the positions of the upper surfaces of the parts are leveled with respect to the mechanically fixing portions.

In addition, the circuit board connecting the LC module and the external connector thereto was mounted there and fixed with screws in the mechanically fixing material 16 thereof in its three sites.

Next, as shown in FIG. 3J, the adhesive 21 for sealing made of a silicone resin was applied to the mating surfaces of the metallic base 20, the external connector 13 and the metallic chasis 17 and was hardened in the thermostat bath.

The external shape of a completed electronic control device had dimensions of 150×150×50 mm.

Table 1 shows the results of the evaluation of characteristics and the reliability tests of an electronic control device fabricated in this manner.

The electronic control device fabricated in this manner is small and low-cost and exhibits high productivity and high heat radiation, thus high temperature operation reliability is high and vibration resistance is excellent.

Example 4

Figure 4:
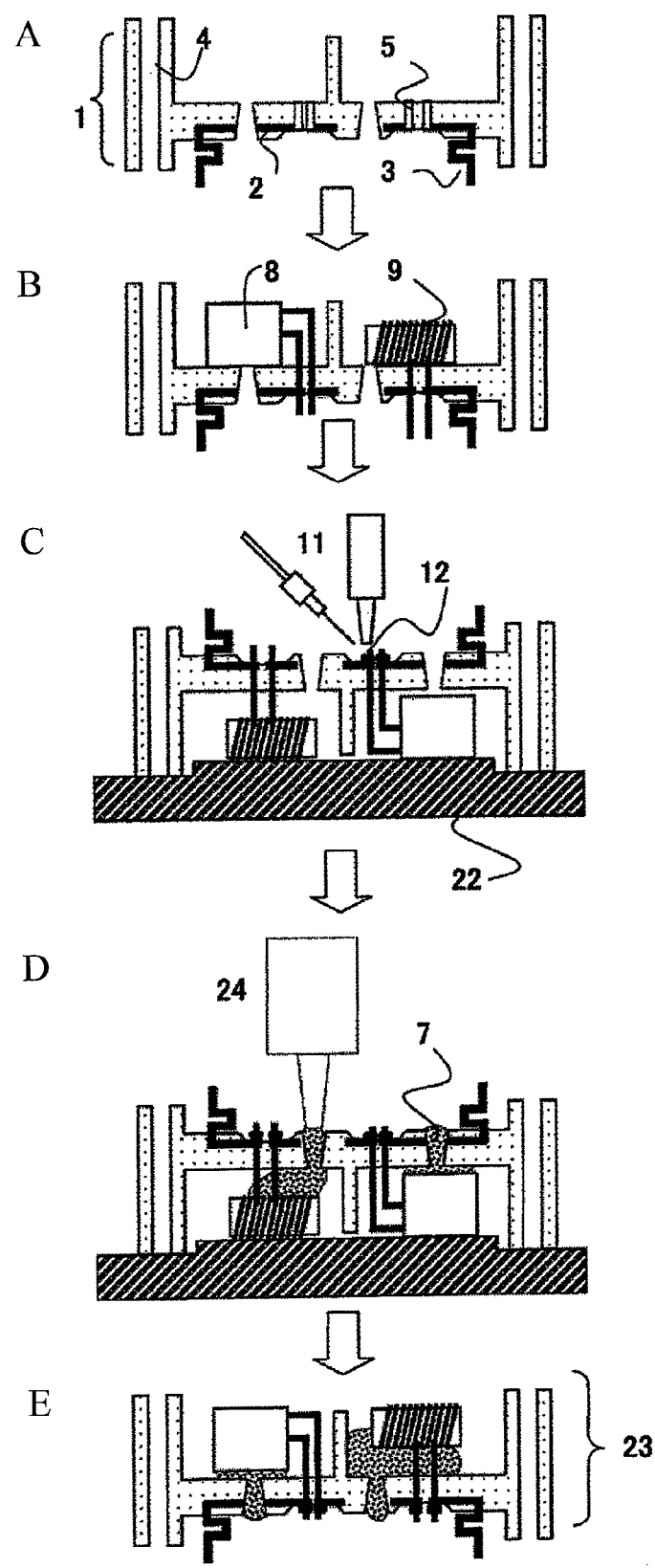
FIG. 4 is a cross-sectional schematic diagram of a step relating to an LC module extracted from a process of manufacturing an electronic control device according to the present invention.

FIG. 4 is a cross-sectional schematic diagram of a process relating to an LC module extracted from a process of manufacturing an electronic control device of Example 4. In FIG. 4A, a support 1 utilizes a copper sheet of a thickness of 600 μm as a wiring 2, and is a case fabricated by insert molding of a thermoplastic resin in which an average wall thickness may be about 1 mm but a wall thickness at mechanically fixing portions and a portion subjected to stress are 1.5 mm or more.

Then, the support has, as the mechanically fixing portions 4, screw holes in which metal cylinders are embedded and has a terminal structure 3 in which the wiring is bent and the tip is processed. In addition, the wiring is appropriately plated.

In addition, an adhesive injection hole is formed in the case bottom, and the holes 5 are formed in the wiring portion for inserting the leads 10. The diameter of each hole is twice the diameter of the lead to be inserted.

Next, as shown in FIG. 4B, the leads 10 of the lead-insertion-type parts such as the capacitor 8, the coil 9 and the sensor (not shown) were inserted into the holes 5 of the wiring of the support and the parts were installed on the support.

After this, as shown in FIG. 4C, the unit was reversed so that the parts were below while the support was above, and then installed to a jig 22 having a surface in contact with the mechanically fixing portions of the support and having a flat portion a certain distance away from the surface. At this time, the hole 5 was two or more times larger than that, and thus the parts were dropped under their own gravity to thereby generate a space between the parts and the support. This leveled the upper surfaces of the parts different in size and shape relative to the mechanically fixing portions.

Next, under this condition, the electric joint 12 of the lead and the wiring was formed with the electric connection device 11.

Then, as shown in FIG. 4D, the top and bottom not turned upside down, the adhesive 7 for fixation made of an epoxy resin with a viscosity of 150 Pa·s, a thixotropy of 1.5 and a post-hardening elastic modulus of 3 GPa was applied to a space between the parts and the support and was hardened, to thereby fabricate the LC module 23, as shown in FIG. 4E.

Thereafter, an electronic control device was fabricated as in Example 3. Table 1 shows the results of the evaluation of characteristics and the reliability tests of an electronic control device fabricated in this manner. The electronic control device fabricated in this manner is small and low-cost and exhibits high productivity and high heat radiation, thus high temperature operation reliability is high.

Example 5

Figure 5:
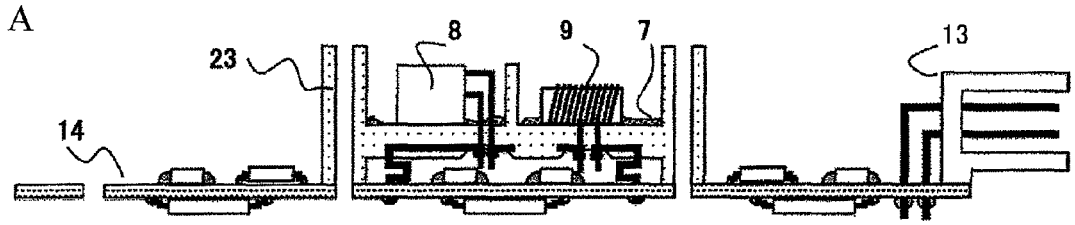
FIG. 5 is a cross-sectional schematic diagram related to a process of manufacturing an electronic control device according to the present invention.
Figure 5:
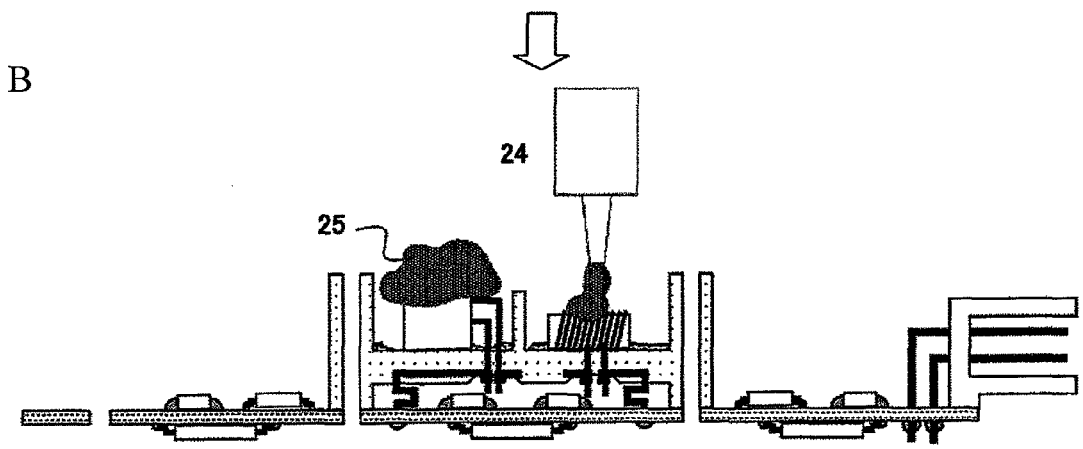
Figure 5:
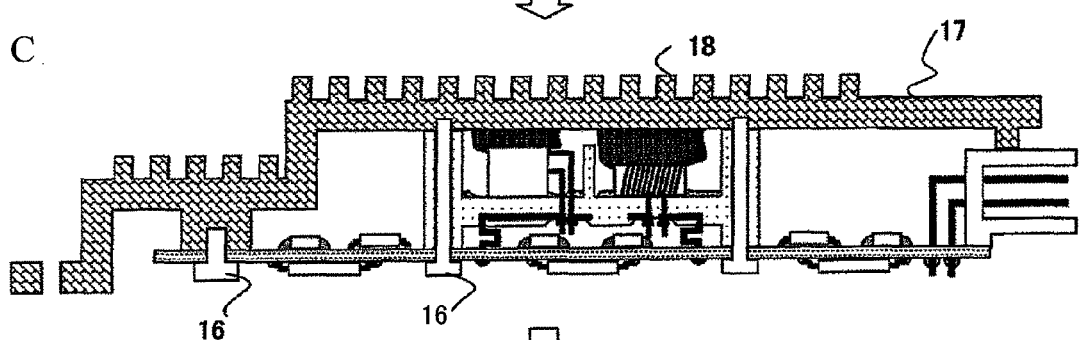
Figure 5:
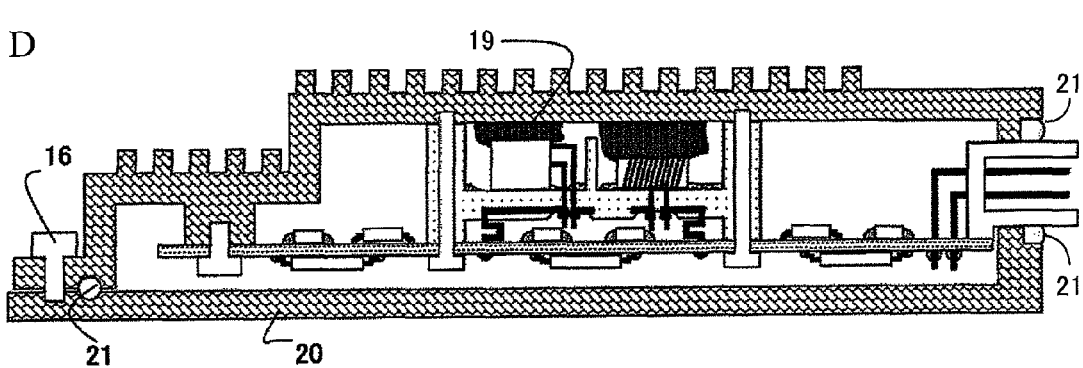

FIG. 5 shows a cross-sectional schematic diagram concerning a process of manufacturing an electronic control device of Example 5. In FIG. 5A, to fabricate an LC module 23, a same support as in Example 3 was used. A capacitor 8 and a coil 9 were mounted on the support. Then an adhesive 7 for fixation made of an epoxy resin with a viscosity of 50 Pa·s, a thixotropy of 1.1 and a post-hardening elastic modulus of 3 GPa was applied and was hardened to fix parts. In addition, leads of the parts and a wiring were electrically connected.

The LC module 23 and the external connector 13 were mounted on a circuit board 14 mounting surface mount parts, and then electrical connection was made by means of a spot flow.

Next, as shown in FIG. 5B, an adhesive 25 of a precursor of a thermally conductive material with a thermal conductivity of 1/mK and an elastic modulus of 100 MPa after hardening was applied onto the parts of the LC module with a dispenser 24.

Next, as shown in FIG. 5C, a metallic chasis 17 provided with the heat radiation fin 18 was fixed with use of screws as the mechanically fixing materials 16 in two sites.

Next, as shown in FIG. 5D, an adhesive 21 for sealing made of a silicone resin was applied to the mating surfaces of a metallic base 20, the external connector 13 and the metallic chasis 17 and was hardened in a thermostat bath. At this time, the adhesive of a precursor of the thermally conductive material was also hardened to become the thermally conductive material 19.

The external shape of a completed electronic control device had dimensions of 150×150×50 mm.

Table 1 shows the results of the evaluation of characteristics and the reliability tests of an electronic control device fabricated in this manner.

The electronic control device fabricated in this manner is small and low-cost and exhibits high productivity and high heat radiation, thus high temperature operation reliability is high and vibration resistance is excellent.

Example 6

Figure 6:
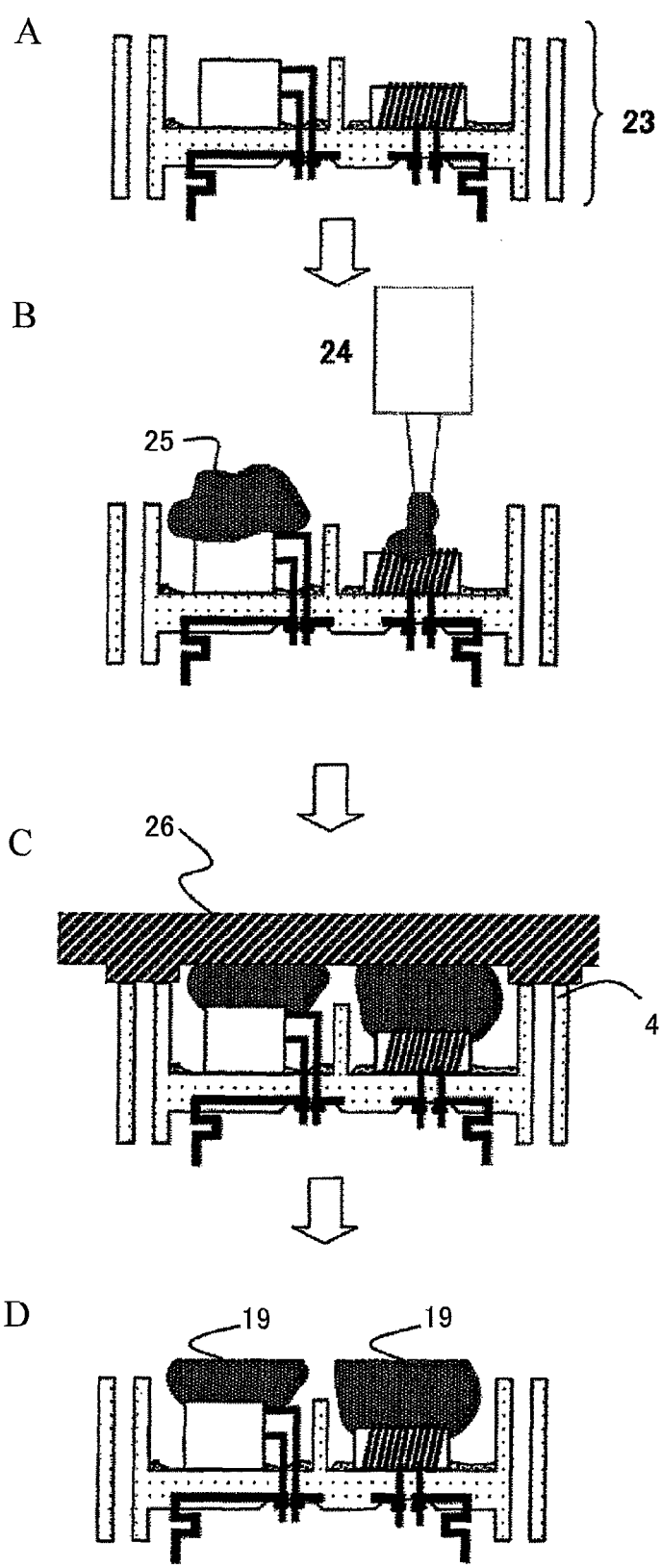
FIG. 6 is a cross-sectional schematic diagram of a process of forming a thermally conductive material on an LC module, the process extracted from a process of manufacturing an electronic control device according to the present invention.

FIG. 6 is a cross-sectional schematic diagram of a process of forming a thermally conductive material on an LC module, relating to a process of manufacturing an electronic control device of Example 6. The LC module 23 of FIG. 6A was fabricated as in Example 5.

Next, as shown in FIG. 6B, an adhesive 25 of a precursor of a thermally conductive material with a thermal conductivity of 1/mK and an elastic modulus of 100 MPa after hardening was applied onto the parts of the LC module with the dispenser 24.

Then, as shown in FIG. 6C, the adhesive 25 was held on a jig 26 having a flat portion at a constant distance relative to mechanically fixing portions 4, and the adhesive was hardened and flattened. The flat portion of the jig is desirably processed for mold release by use of surface treatment or wax in advance.

Next, as indicated in FIG. 6D, when the jig 26 was detached, the thermally conductive material 19 having a flat portion at a constant distance relative to the mechanically fixing portions was formed.

After this, the LC module and the external connector were mounted on the circuit board and electrical connection was made by means of a spot flow, and then a metallic chasis was fixed thereto with use of screws as the mechanically fixing material in three sites.

By changing the shapes of the jig 26 and the metallic chasis, it is possible to change the position of the flat portion of the thermally conductive material 19 for each of the parts.

Next, the adhesive for sealing made of a silicone resin was applied to the mating surfaces of the metallic base, the external connector and the metallic chasis and was hardened in the thermostat bath.

The external shape of a completed electronic control device had dimensions of 150×150×50 mm.

Table 1 shows the results of the evaluation of characteristics and the reliability tests of an electronic control device fabricated in this manner.

The electronic control device fabricated in this manner is small and low-cost and exhibits high productivity and high heat radiation, thus high temperature operation reliability is high and vibration resistance is excellent.

Example 7

Figure 7:
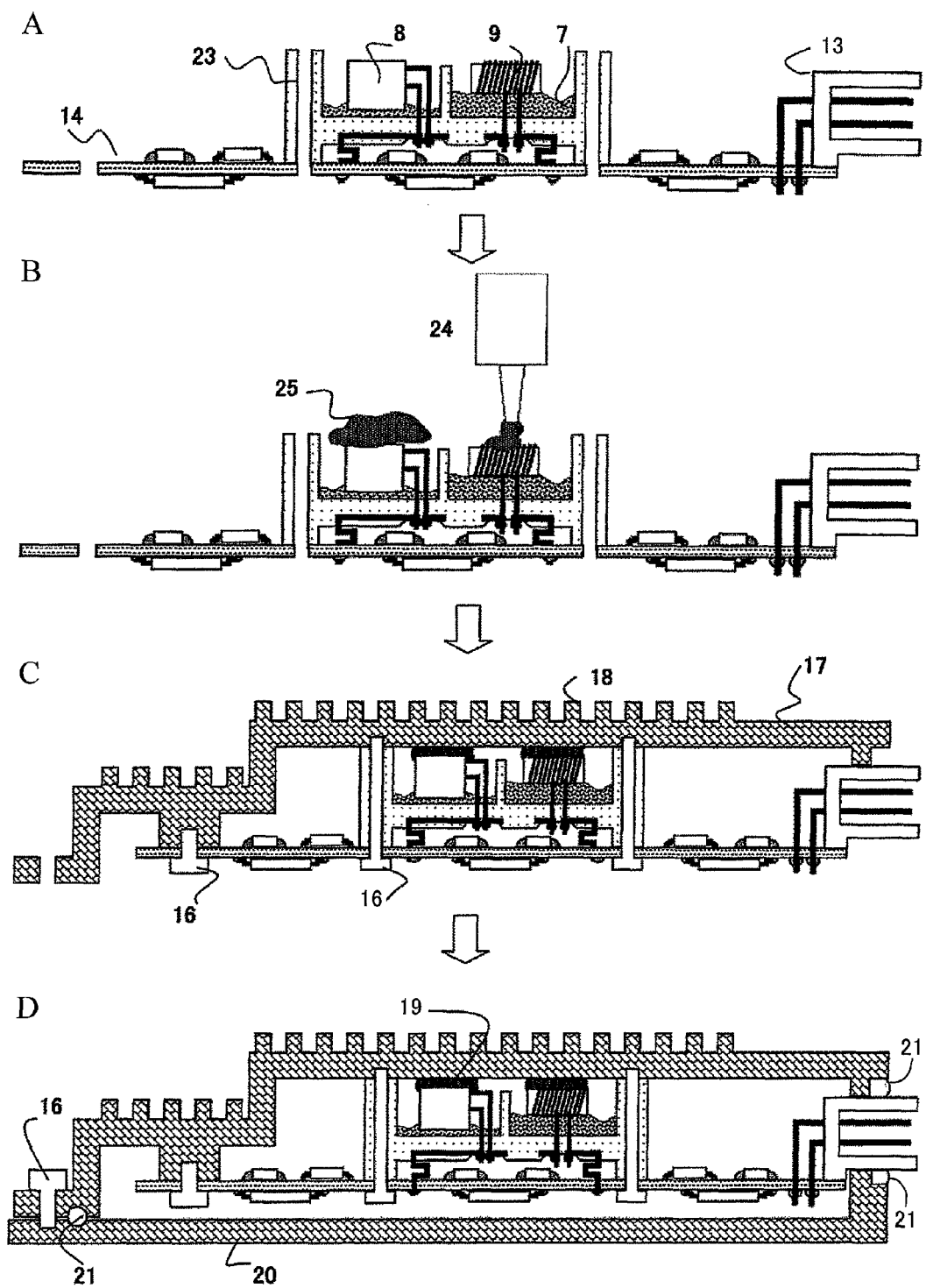
FIG. 7 is a cross-sectional schematic diagram related to a process of manufacturing an electronic control device according to the present invention.

FIG. 7 shows a cross-sectional schematic diagram concerning a process of manufacturing an electronic control device of Example 7. In FIG. 7A, the LC module 23 is fabricated as in Example 3 and mounted on a circuit board.

Next, as shown in FIG. 7B, an adhesive 25 of a precursor of a thermally conductive material with a thermal conductivity of 1/mK and an elastic modulus of 100 MPa after hardening was applied onto the parts of the LC module with the dispenser 24.

Next, as shown in FIG. 7C, a metallic chasis 17 provided with the heat radiation fin 18 was fixed with use of screws as the mechanically fixing materials 16 in two sites.

Next, as shown in FIG. 7D, an adhesive 21 for sealing made of a silicone resin was applied to the mating surfaces of a metallic base 20, an external connector 13 and the metallic chasis 17 and was hardened in a thermostat bath. At this time, the adhesive of a precursor of the thermally conductive material was also hardened to become the thermally conductive material 19.

The external shape of a completed electronic control device had dimensions of 150×150×50 mm.

Table 1 shows the results of the evaluation of characteristics and the reliability tests of an electronic control device fabricated in this manner.

The electronic control device fabricated in this manner is small and low-cost and exhibits high productivity and high heat radiation, thus high temperature operation reliability is high and vibration resistance is excellent.

Example 8

Figure 8:
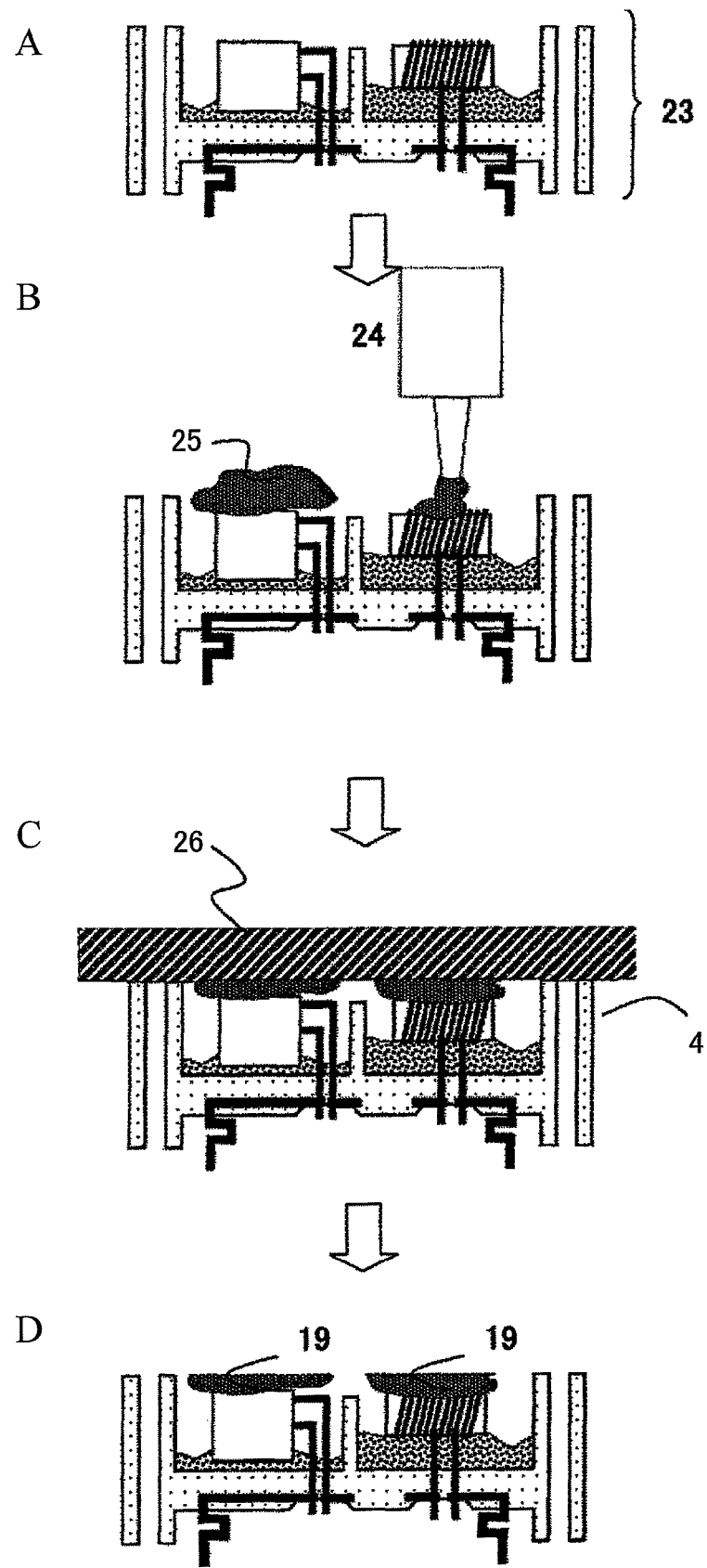
FIG. 8 is a cross-sectional schematic diagram of a process of forming a thermally conductive material on an LC module, the process extracted from a process of manufacturing an electronic control device according to the present invention.

FIG. 8 is a cross-sectional schematic diagram of a process of forming a thermally conductive material on an LC module, relating to a process of manufacturing an electronic control device of Example 8. In FIG. 8A, the LC module 23 was fabricated as in Example 3.

Next, as shown in FIG. 8B, an adhesive 25 of a precursor of a thermally conductive material with a thermal conductivity of 1/mK and an elastic modulus of 100 MPa after hardening was applied onto the parts of the LC module with the dispenser 24.

Then, as shown in FIG. 8C, the adhesive 25 was held on a jig 26 having a flat portion at a constant distance relative to mechanically fixing portions 4, and the adhesive was hardened and flattened. The flat portion of the jig is desirably processed for mold release by use of surface treatment or wax in advance.

Next, as indicated in FIG. 8D, when the jig 26 was detached, the thermally conductive material 19 having a flat portion at a constant distance relative to the mechanically fixing portions was formed.

After this, the LC module and the external connector were mounted on the circuit board and electrical connection was made by means of a spot flow, and then a metallic chasis was fixed thereto with use of screws as the mechanically fixing materials in three sites.

Next, the adhesive for sealing made of a silicone resin was applied to the mating surfaces of the metallic base, the external connector and the metallic chasis and was hardened in the thermostat bath.

The external shape of a completed electronic control device had dimensions of 150×150×50 mm.

Table 1 shows the results of the evaluation of characteristics and the reliability tests of an electronic control device fabricated in this manner.

The electronic control device fabricated in this manner is small and low-cost and exhibits high productivity and high heat radiation, thus high temperature operation reliability is high and vibration resistance is excellent.

Example 9

Figure 9:
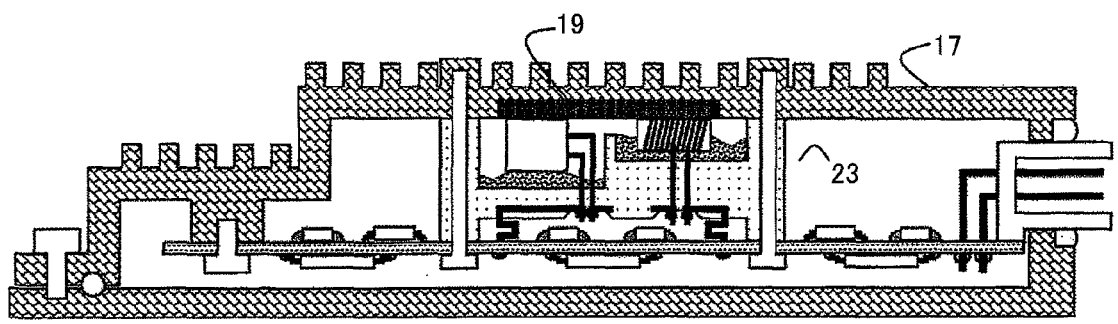
FIG. 9 is a cross-sectional schematic diagram of an electronic control device according to the present invention.

FIG. 9 shows a cross-sectional schematic diagram of an electronic control device of Example 9. The LC module 23 was fabricated similarly to Example 3, in consideration of the heights of parts, by use of a case, for a support, in which wall thickness of the bottom thereof was changed. Due to the change in the wall thickness of the bottom, the space between the parts and the support is small. However, due to the presence of height tolerance even among the parts of the same specification, space between the parts and the support is needed in order to level the positions in the upper surfaces of the parts.

In addition, besides this, an adhesive of a precursor of a thermally conductive material was applied in advance to a metallic chasis 17 and hardened to thereby fabricate the metallic chasis having a heat-radiated material bonded thereto. Use of this makes it possible to remove a process of placing the thermally conductive material 19 in the metallic chasis in the manufacturing step of Example 3, thereby being capable of improving productivity. Other than this, an electronic control device was fabricated similarly to Example 3.

The external shape of a completed electronic control device had dimensions of 150×150×50 mm.

Table 1 shows the results of the evaluation of characteristics and the reliability tests of an electronic control device fabricated in this manner.

The electronic control device fabricated in this manner is small and low-cost and exhibits high productivity and high heat radiation, thus high temperature operation reliability is high and vibration resistance is excellent.

Example 10

Figure 10:
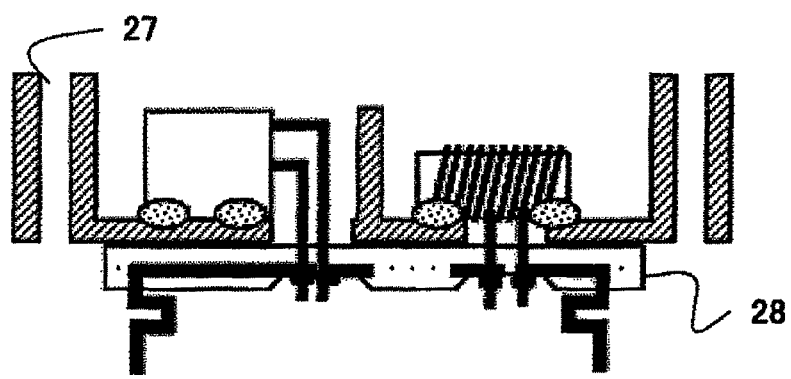
FIG. 10 is a cross-sectional schematic diagram of an LC module used for an electronic control device according to the present invention.

FIG. 10 shows a cross-sectional schematic diagram of an LC module used for an electronic control device of Example 10. The feature is that a metallic case 27 having mechanically fixing portions and a flat plate 28 in which a terminal structure is insert-molded are bonded to each other to form a support.

An electronic control device was fabricated as in Example 1 by use of the support.

The external shape of a completed electronic control device had dimensions of 150×150×50 mm.

Table 1 shows the results of the evaluation of characteristics and the reliability tests of an electronic control device fabricated in this manner.

The electronic control device fabricated in this manner is small and low-cost and exhibits high productivity and high heat radiation, thus high temperature operation reliability is high and vibration resistance is excellent.

Example 11

Figure 11:
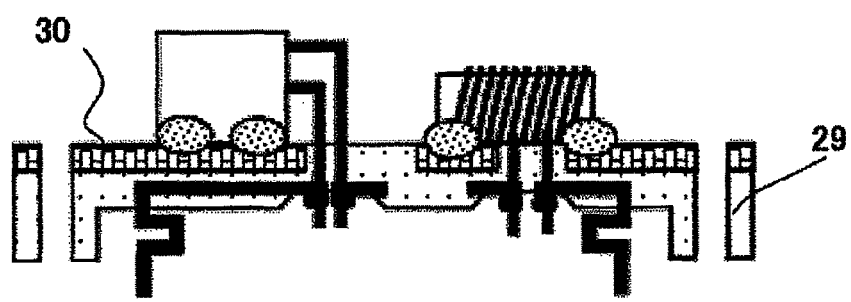
FIG. 11 is a cross-sectional schematic diagram of an LC module used for an electronic control device according to the present invention.

FIG. 11 shows a cross-sectional schematic diagram of an LC module used for an electronic control device of Example 11. The feature is that a case in which a heat radiation material 30 is insert-molded is used for a support.

An electronic control device was fabricated as in Example 1 by use of the support.

The external shape of a completed electronic control device had dimensions of 150×150×50 mm.

Table 1 shows the results of the evaluation of characteristics and the reliability tests of an electronic control device fabricated in this manner.

The electronic control device fabricated in this manner is small and low-cost and exhibits high productivity and high heat radiation, thus high temperature operation reliability is high and vibration resistance is excellent.

Example 12

Figure 12:
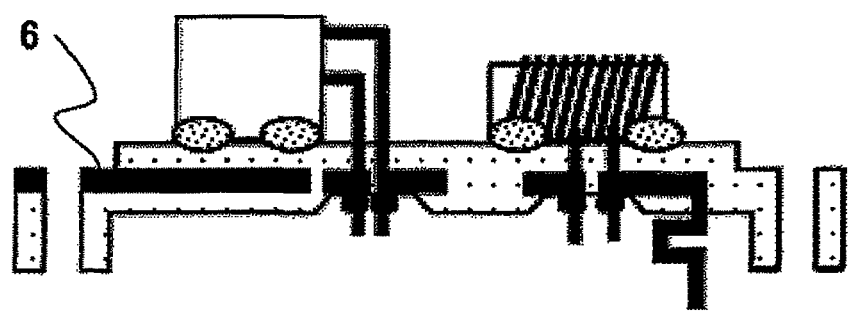
FIG. 12 is a cross-sectional schematic diagram of an LC module used for an electronic control device according to the present invention.

FIG. 12 shows a cross-sectional schematic diagram of an LC module used for an electronic control device of Example 12. The feature is that a case in which a wiring 6 for heat radiation is insert-molded is used for a support.

An electronic control device was fabricated as in Example 1 by use of the support.

The external shape of a completed electronic control device had dimensions of 150×150×50 mm.

Table 1 shows the results of the evaluation of characteristics and the reliability tests of an electronic control device fabricated in this manner.

The electronic control device fabricated in this manner is small and low-cost and exhibits high productivity and high heat radiation, thus high temperature operation reliability is high and vibration resistance is excellent.

Example 13

Figure 13:
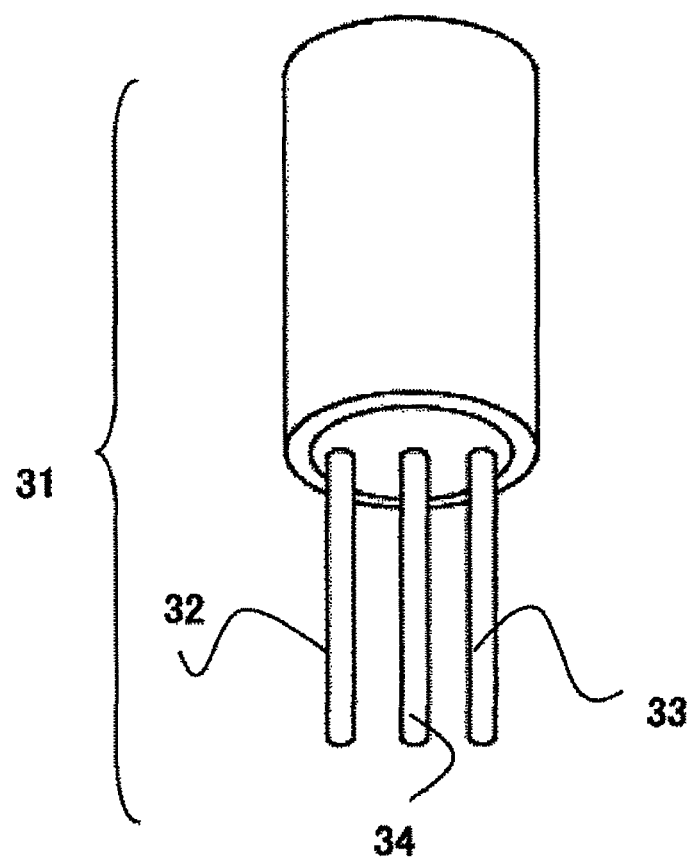
FIG. 13 is a schematic diagram of an appearance of a capacitor according to the present invention.

FIG. 13 shows a schematic diagram of an appearance of a capacitor used for an electronic control device of Example 13. The feature is that a lead 34 for heat radiation is present in addition to leads of an anode 32 and a cathode 33 of a conventional capacitor.

Figure 14:
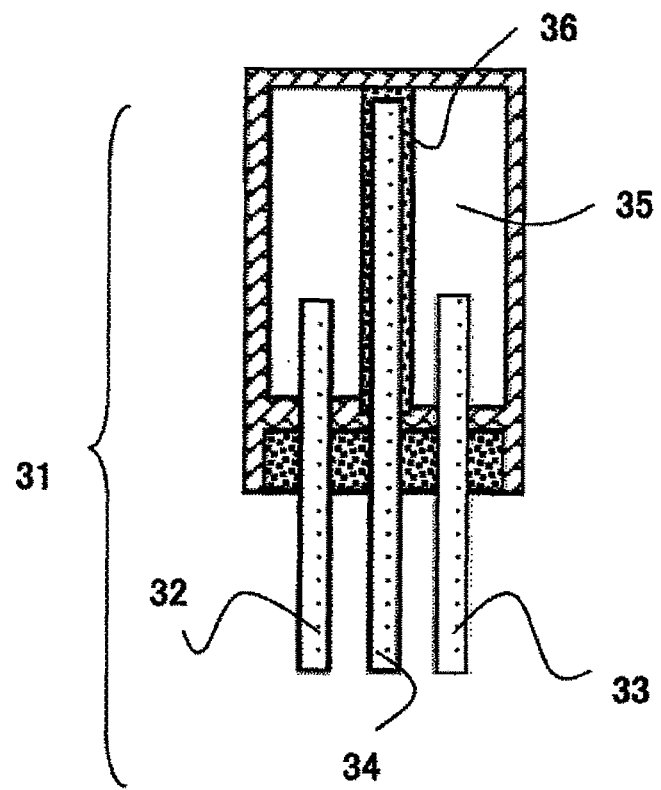
FIG. 14 is a cross-sectional schematic diagram of a capacitor according to the present invention.

FIG. 14 is a cross-sectional schematic diagram of the capacitor. The lead 34 for heat radiation is electrically insulated from a laminate 35 of an aluminum foil and an electrolyte with insulation material 36.

Figure 15:
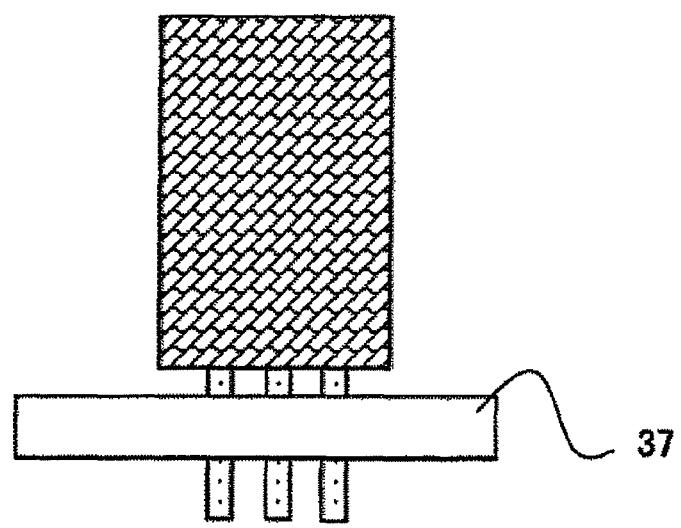
FIG. 15 is a schematic diagram when a capacitor according to the present invention is mounted on a substrate or a wiring.

FIG. 15 is a schematic diagram when the capacitor is mounted on a substrate or a wiring 37. The lead for heat radiation is also mounted in addition to the anode and the cathode. This makes it possible to cool the inside of the capacitor by way of the wiring or the substrate.

An electronic control device was fabricated as in Example 1 by use of the capacitor.

The external shape of a completed electronic control device had dimensions of 150×150×50 mm.

Table 1 shows the results of the evaluation of characteristics and the reliability tests of an electronic control device fabricated in this manner.

The electronic control device fabricated in this manner is small and low-cost and exhibits high productivity and high heat radiation, thus high temperature operation reliability is high and vibration resistance is excellent.

Example 14

Figure 18:
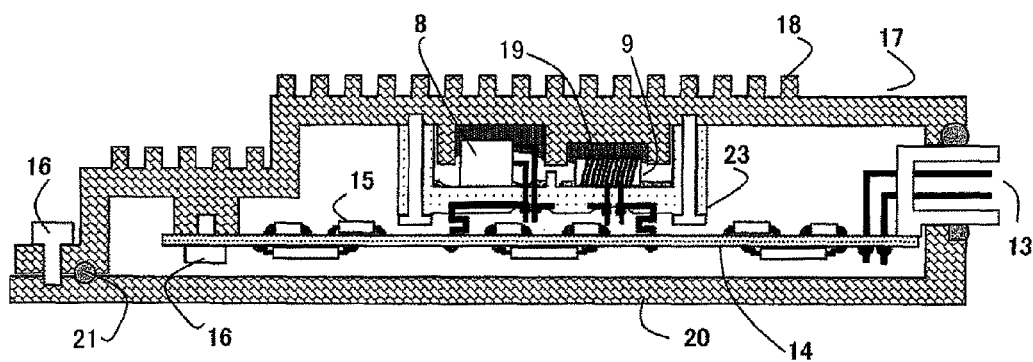
FIG. 18 is a cross-sectional schematic diagram of an electronic control device of a Comparative Example.

FIG. 18 shows a cross-sectional schematic diagram of an electronic control device of Example 14. To fabricate an LC module 23, a same support as in Example 3 was used. A capacitor 8 and a coil 9 were mounted on the support. Then an adhesive 7 for fixation made of a silicone resin with a viscosity of 50 Pa·s, a thixotropy of 1.1 and a post-hardening elastic modulus of 0.1 GPa was applied and was hardened to fix the parts. In addition, leads of the parts and a wiring were electrically connected.

A metallic chasis 17 includes a fixing portion for fixing a heat radiation fin 18 and an LC module and a concave portion filled with a thermally conductive material. An adhesive 25 of a precursor of a thermally conductive material with a thermal conductivity 1/mK and an elastic modulus of 0.005 MPa after hardening was applied to a concave portion with a dispenser and then the LC module 23 was fixed to the metallic chasis 17 in three sites with the thermally conductive material unhardened.

Next, a circuit board 14 that mounted an external connector 13 and surface mount parts was fixed to the metallic chasis and was electrically connected to the LC module with a spot flow.

Then, an adhesive 21 for sealing made of a silicone resin was applied to the mating surfaces of a metallic base 20, the external connector 13 and the metallic chasis 17 and was hardened in a thermostat bath. At this time, the adhesive of a precursor of the thermally conductive material was also hardened to become the thermally conductive material 19.

The external shape of a completed electronic control device had dimensions of 150×150×50 mm.

Table 1 shows the results of the evaluation of characteristics and the reliability tests of an electronic control device fabricated in this manner.

An electronic control device fabricated in this manner allows the amount of a thermally conductive material to be small, thereby being capable of lowering the cost. The force of pressing the thermally conductive material against a metallic chasis does not work on the joint of the capacitor 8 and the coil 9. Therefore, the electronic control device has a little stress applied to the soldered portion, is excellent in temperature cycle reliability, is small in size, high in productivity and high in heat radiation, thereby being high in high temperature operation reliability and excellent in vibration resistance.

Comparative Example 1

Figure 16:
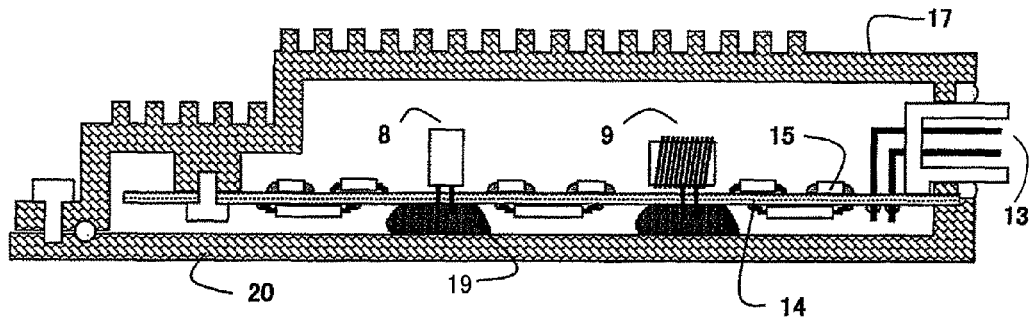
FIG. 16 is a cross-sectional schematic diagram of an electronic control device of a Comparative Example.

FIG. 16 shows a cross-sectional schematic diagram of an electronic control device of Comparative Example 1. Surface mount parts 15, lead-insertion-type parts such as a capacitor 8, and a coil 9 are mounted on a circuit board 14, and mechanically fixed to a metallic chasis 17.

Moreover, the installation of a metallic base 20 provided with a thermally conductive material 19 allows the heat of the coil and capacitor to be released from the substrate side.

The external shape of a completed electronic control device had dimensions of 200×200×50 mm.

Table 1 shows the results of the evaluation of characteristics and the reliability tests of an electronic control device fabricated in this manner.

The electronic control device fabricated in this manner creates the problems of being a large size due to a large circuit board, of exhibiting poor productivity due to difficult mounting of the lead-insertion-type parts, of exhibiting poor heat radiation and low high-temperature operation reliability because the thermally conductive material does not directly touch heat release parts, and of being inferior in vibration resistance because the lead-insertion-type parts are not fixed.

Comparative Example 2

Figure 17:
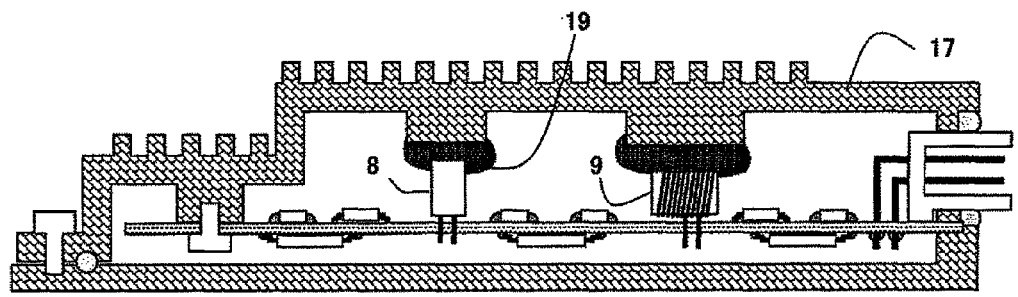
FIG. 17 is a cross-sectional schematic diagram of an electronic control device of a Comparative Example.

FIG. 17 shows a cross-sectional schematic diagram of an electronic control device of Comparative Example 2. Surface mount parts 15, lead-insertion-type parts such as a capacitor 8 and a coil 9 and the external connector 13 are mounted on a circuit board 14, and then the capacitor and coil portions are mechanically fixed to a metallic chasis 17 via a thermally conductive material 19.

The external shape of a completed electronic control device had dimensions of 200×200×50 mm.

Table 1 shows the results of the evaluation of characteristics and the reliability tests of an electronic control device fabricated in this manner.

The electronic control device fabricated in this manner poses the problems of becoming a large size due to a large circuit board, of needing to make thick a thermally conductive material and thus being high in cost since the height tolerance of the lead-insertion-type parts and the tolerance of the insertion depth when the lead is inserted are large, of exhibiting poor productivity since the mounting of the lead-insertion-type parts is difficult and since the thermally conductive material is placed on capacitors and coils dispersedly mounted, of being poor in heat radiation and low in high temperature operation reliability due to a thick thermally conductive material, and of being inferior in vibration resistance since the lead-insertion-type parts are not fixed enough.

TABLE 1

|  |  |  | Example 1 | Example 2 | Example 3 | Example 4 | Example 5 |
|---|---|---|---|---|---|---|---|
| Character-istics | Metallic base | Material | Aluminum | Aluminum | Aluminum | Aluminum | Aluminum |
|  | Metallic chasis | Material | Aluminum | Aluminum | Aluminum | Aluminum | Aluminum |
|  | LC Module | Support Shape | Flat plate | Flat plate | Case shape | Case shape having an adhesive injection hole | Case shape |
|  |  | Mechanical fixing portion | Screw hole | Screw hole | Screw hole | Screw hole | Screw hole |
|  |  | Wiring | Aluminum | Aluminum | Copper | Copper | Copper |

TABLE 1-continued

| | | | | | | | | |
|---|---|---|---|---|---|---|---|---|
| | | | | | or copper wiring of a thickness of 200 μm | or copper wiring of a thickness of 200 μm | plate of a thickness of 600 μm | plate of a thickness of 600 μm | plate of a thickness of 600 μm |
| | | | Terminal | | Through hose insertion type | Through hose insertion type | Copper wiring | Copper wiring | Copper wiring |
| | | Adhesive for fixation | Material | | Silicone resin | Epoxy resin | Epoxy resin | Epoxy resin | Epoxy resin |
| | | | Properties | Viscosity | 200 | 200 | 50 | 150 | 50 |
| | | | | Thixotropy | 1.6 | 1.5 | 1.1 | 1.5 | 1.1 |
| | | | | Elastic modulus after hardened | 1 | 3000 | 3000 | 3000 | 3000 |
| | | | Upper surfaces of parts | | Not leveled | Leveled | Leveled | Leveled | Not leveled |
| | | Material for heat radiation | Properties | Thermal conductivity | 1 | 1 | 1 | 1 | 1 |
| | | | | Elastic modulus | 0.1 | 100 | 100 | 100 | 100 |
| | | | | Attribute | Sheet | Sheet | Sheet | Sheet | Adhesive |
| | | | Thickness | On coil | 5 | 1 | 1 | 1 | 5 |
| | | | | On capacitor | 3 | 1 | 1 | 1 | 3 |
| Features | | Size of electronic control devices | | | ◯ | ◯ | ◯ | ◯ | ◯ |
| | | Number of mechanical fixing portion of LC modules | | | 4 | 4 | 3 | 3 | 2 |
| | | Cost of Thermally conductive material | | | ◯ | "excellent" | "excellent" | "excellent" | ◯ |
| | | Productivity of assembly process | | | ◯ | ◯ | ◯ | "excellent" | ◯ |
| Reli- ability | | Temperature cycle reliability | | | ◯ | ◯ | ◯ | ◯ | ◯ |
| | | High temperature operation reliability | | | ◯ | "excellent" | "excellent" | "excellent" | ◯ |
| | | Vibration resistance | | | ◯ | ◯ | "excellent" | "excellent" | "excellent" |

| | | | | | Example 6 | Example 7 | Example 8 | Example 9 | Example 10 |
|---|---|---|---|---|---|---|---|---|---|
| Character- istics | Metallic base | | Material | | Aluminum | Aluminum | Aluminum | Aluminum | Aluminum |
| | Metallic chasis | | Material | | Aluminum | Aluminum | Aluminum | Aluminum | Aluminum |
| | LC Module | Support | Shape | | Case shape | Case shape | Metal case + insert molding wiring | Case shape | Case shape |
| | | Mechanical fixing portion | | | Screw hole | Screw hole | Screw hole | Screw hole | Screw hole |
| | | Wiring | | | Copper plate of a thickness of 600 μm | Copper plate of a thickness of 600 μm | Copper plate of a thickness of 600 μm | Copper plate of a thickness of 600 μm | Copper plate of a thickness of 600 μm |
| | | Terminal | | | Copper wiring | Copper wiring | Copper wiring | Copper wiring | Copper wiring |
| | | Adhesive for fixation | Material | | Epoxy resin | Epoxy resin | Silicone resin | Epoxy resin | Epoxy resin |
| | | | Properties | Viscosity | 50 | 150 | 50 | 50 | 50 |
| | | | | Thixotropy | 1.1 | 1.5 | 1.1 | 1.1 | 1.1 |
| | | | | Elastic modulus after hardened | 3000 | 3000 | 3000 | 3000 | 3000 |
| | | | Upper surfaces of parts | | Not leveled | Leveled | Leveled | Not leveled | Leveled |
| | | Material for heat radiation | Properties | Thermal conductivity | 1 | 1 | 1 | 1 | 1 |
| | | | | Elastic modulus | 100 | 100 | 0.1 | 100 | 100 |
| | | | | Attribute | Adhesive hardened material (applied onto parts in advance and then hardened) | Adhesive hardened material (applied onto parts in advance and then flattened and hardened) | Sheet | Adhesive | Adhesive hardened material (applied onto a metallic chasis in advance and then hardened) |
| | | | Thickness | On coil | 5 | 1 | 5 | 1 | 1 |
| | | | | On capacitor | 3 | 1 | 3 | 1 | 1 |
| Features | | Size of electronic control devices | | | ◯ | ◯ | ◯ | ◯ | ◯ |
| | | Number of mechanical fixing portion of LC modules | | | 3 | 2 | 3 | 3 | 3 |
| | | Cost of Thermally conductive material | | | ◯ | "excellent" | ◯ | ◯ | ◯ |
| | | Productivity of assembly process | | | ◯ | ◯ | "excellent" | "excellent" | ◯ |
| Reli- ability | | Temperature cycle reliability | | | ◯ | ◯ | ◯ | ◯ | ◯ |
| | | High temperature operation reliability | | | ◯ | "excellent" | "excellent" | "excellent" | ◯ |
| | | Vibration resistance | | | "excellent" | "excellent" | "excellent" | "excellent" | "excellent" |

| | | | | | Example 11 | Example 12 | Example 13 | Comparative Example 1 | Comparative Example 2 |
|---|---|---|---|---|---|---|---|---|---|
| Character- istics | Metallic base | | Material | | Aluminum | Aluminum | Aluminum | Aluminum | Aluminum |
| | Metallic chasis | | Material | | Aluminum | Aluminum | Aluminum | Aluminum | Aluminum |
| | LC | Support | Shape | | Case shape | Case shape | Flat plate | None | None |

TABLE 1-continued

| Module | | | | having material for heat radiation | having material for heat radiation | | | |
|---|---|---|---|---|---|---|---|---|
| | | Mechanical fixing portion | | Screw hole | Screw hole | Screw hole | | |
| | | Wiring | | Copper plate of a thickness of 600 μm | Copper plate of a thickness of 600 μm | Aluminum or copper wiring of a thickness of 200 μm | | |
| | | Terminal | | Copper wiring | Copper wiring | Through hose insertion type | | |
| | Adhesive for fixation | Material | | Silicone resin | Silicone resin | Silicone resin | | |
| | | Properties | Viscosity | 50 | 50 | 200 | | |
| | | | Thixotropy | 1.1 | 1.1 | 1.6 | | |
| | | | Elastic modulus after hardened | 3000 | 3000 | 1 | | |
| | | Upper surfaces of parts | | Not leveled | Not leveled | Not leveled | | |
| | Material for heat radiation | Properties | Thermal conductivity | 1 | 1 | 1 | 1 | 1 |
| | | | Elastic modulus | 0.1 | 0.1 | 0.1 | 0.1 | 0.1 |
| | | | Attribute | Sheet | Sheet | Sheet | Sheet | Sheet |
| | | Thickness | On coil | 5 | 5 | 5 | 3 | 7 |
| | | | On capacitor | 3 | 3 | 3 | 3 | 7 |
| Features | Size of electronic control devices | | | ○ | ○ | ○ | × | × |
| | Number of mechanical fixing portion of LC modules | | | 3 | 3 | 3 | — | — |
| | Cost of Thermally conductive material | | | ○ | ○ | ○ | ○ | × |
| | Productivity of assembly process | | | ○ | ○ | ○ | × | × |
| Reliability | Temperature cycle reliability | | | ○ | ○ | ○ | ○ | × |
| | High temperature operation reliability | | | ○ | ○ | "excellent" | × | ○ |
| | Vibration resistance | | | "excellent" | "excellent" | ○ | × | × |

Characteristics, features and reliabilities of Examples 1 to 8 are indicated.
Characteristics, features and reliabilities of Examples 9 to 14 and Comparative Examples 1 and 2 are indicated.

Explanation of Reference Numerals

1 ... Support
2 ... Wiring
3 ... Terminal structure
4 ... Mechanically fixing portions
5 ... Hole
6 ... Wiring for heat radiation
7 ... Adhesive for fixation
8 ... Capacitor
9 ... Coil
10 ... Lead
11 ... Electric connection device
12 ... Electric joint
13 ... External connector
14 ... Circuit board
15 ... Surface mount parts
16 ... Mechanically fixing material
17 ... Metallic chasis
18 ... Heat radiation fin
19 ... Thermally conductive material
20 ... Metallic base
21 ... Adhesive for sealing
22 ... Jig for leveling height of parts
23 ... LC module
24 ... Dispenser
25 ... Adhesive of a precursor of thermally conductive material
26 ... Adhesive flattening jig
27 ... Metal case
28 ... Insert molding wiring
29 ... Insert molding case having material for heat radiation
30 ... Material for heat radiation
31 ... Aluminum electrolytic capacitor having a lead for heat radiation
32 ... Anode
33 ... Cathode
34 ... Lead for heat radiation
35 ... Laminate of aluminum foil and electrolyte
36 ... Insulative material
37 ... Substrate or wiring
38 ... Battery
39 ... Electronic control device
40 ... Motor or actuator
41 ... Filter circuit
42 ... Boost circuit
43 ... Control circuit
44 ... Power circuit

What is claimed is:

1. An electronic control device comprising two or more kinds of lead-insertion-type parts, including at least a coil and a capacitor, wherein
the parts are installed on a support that has a wiring, a terminal structure and mechanically fixing portions,
leads of the parts are respectively inserted in and electrically connected to holes formed in the wiring portion of the support,
the parts and the support are fixed to each other with an adhesion material for fixation,
the upper surfaces of the parts are tightly attached to a metallic chassis through a thermally conductive material of a low elasticity modulus,
the mechanically fixing portions of the support are fixed to the metallic chassis, and
the terminal structure of the support is electrically connected to a circuit board that mounts at least a controlling element.

2. The electronic control device according to claim 1, wherein a space is formed between the parts and the support, and the positions of the upper surfaces of two or more kinds of the parts are leveled.

3. The electronic control device according to claim 1, wherein the support has a case-like shape formed by insert molding.

4. The electronic control device according to claim 1, wherein the thermally conductive material has a sheet-like shape.

5. The electronic control device according to claim 1, wherein the support is provided with holes for injecting the adhesive for fixation.

6. The electronic control device according to claim 1, wherein the elastic modulus of the adhesive for fixation is larger than the elastic modulus of the thermally conductive material.

7. The electronic control device according to claim 1, wherein the thermally conductive material is a hardened material of an adhesive.

8. The electronic control device according to claim 7, wherein the thermally conductive material is in contact with the metallic chasis and the parts and is bonded to only either one of the metallic chasis and the parts.

9. The electronic control device according to claim 1, wherein the mechanically fixing portion of the metallic chasis is projected outward and functions as a part of a heat sink.

10. The electronic control device according to claim 1, wherein the support is formed of a combination of a thermoplastic resin produced by insert molding of a terminal structure element and a wiring, and a metal case having the mechanically fixing portions.

11. The electronic control device according to claim 1, wherein at least a capacitor mounting portion of the support has a metal material for heat radiation embedded inside a surface of the capacitor mounting portion, the surface being in contact with a capacitor, and has a wiring outside the surface.

12. The electronic control device according to claim 1, wherein at least the capacitor mounting portion of the support has a wiring for heat radiation.

13. The electronic control device according to claim 1, wherein
   the capacitor has a lead of an anode, a lead of a cathode, and a lead for heat radiation in the central portion of the capacitor,
   the lead for heat radiation has at least an electrically insulated portion that is in contact with an aluminum foil or an electrolyte inside the capacitor, and
   the capacitor is an aluminum electrolytic capacitor having three leads, which are the lead of an anode, the lead of a cathode, and the lead for heat radiation, connected to the substrate or metal wiring.

14. An electronic control device comprising:
   two or more kinds of lead-insertion-type parts, including at least a coil and a capacitor;
   a metallic chasis;
   a circuit board mounting at least a controlling element;
   a support having a wiring portion, a terminal structure electrically connected to the circuit board, and mechanically fixing portions for fixing the support to the metallic chasis;
   the two or more kinds of the parts electrically connected to the wiring portion in a state in which leads are respectively inserted into holes formed in the support and in which a space is formed between the parts and the support; and
   a thermally conductive material in contact with the two or more kinds of parts and the metallic chasis.

* * * * *